(12) United States Patent
Rahman et al.

(10) Patent No.: US 8,563,954 B2
(45) Date of Patent: Oct. 22, 2013

(54) ION BEAM STABILIZATION

(75) Inventors: FHM-Faridur Rahman, Peabody, MA (US); Louis S. Farkas, III, Durham, NH (US); John A. Notte, IV, Gloucester, MA (US)

(73) Assignee: Carl Zeiss Microscopy, LLC, Thornwood, NY (US)

( * ) Notice: Subject to any disclaimer, the term of this patent is extended or adjusted under 35 U.S.C. 154(b) by 0 days.

(21) Appl. No.: 13/336,274

(22) Filed: Dec. 23, 2011

(65) Prior Publication Data
US 2012/0097849 A1    Apr. 26, 2012

Related U.S. Application Data

(62) Division of application No. 12/548,764, filed on Aug. 27, 2009, now Pat. No. 8,093,563.

(60) Provisional application No. 61/093,064, filed on Aug. 29, 2008.

(51) Int. Cl.
*H01J 49/00* (2006.01)

(52) U.S. Cl.
USPC ............ 250/493.1; 250/423 F; 250/396 R

(58) Field of Classification Search
USPC .................................................. 250/493.1
See application file for complete search history.

(56) References Cited

U.S. PATENT DOCUMENTS

| | | | |
|---|---|---|---|
| 3,911,311 A | 10/1975 | Heil | |
| 4,139,773 A | 2/1979 | Swanson | |
| 4,367,429 A * | 1/1983 | Wang et al. | 313/362.1 |
| 7,423,277 B2 | 9/2008 | Perel et al. | |
| 7,495,242 B2 * | 2/2009 | Zani et al. | 250/492.21 |
| 7,589,328 B2 * | 9/2009 | Frosien et al. | 250/423 F |
| 2007/0158558 A1 * | 7/2007 | Ward et al. | 250/309 |
| 2009/0230299 A1 * | 9/2009 | Shichi et al. | 250/282 |

FOREIGN PATENT DOCUMENTS

EP    2 088 613 A1    8/2009

OTHER PUBLICATIONS

Andren and Henjered, "On the charge state of tungsten ions in the pulsed-field atom probe," Surface Science, 138(1):227-236, (1984).
Averback and Seidman, "Neon gas imaging of gold in the field ion microscope," Surface Science, 40(2):249-263, (1973).
Carroll et al., "Field-ion imaging of titanium and effects due to hydrogen," Surface Science, 45(2):640-648, (1974).
De Castilho and Kingham, "Calculations of field ionization in the field ion microscope," Surface Science, 173(1):75-96, (1986).
Graham and Ehrlich, "Direct identification of atomic binding sites on a crystal," Surface Science, 45(2):530-552, (1974).
Horiuchi et al., "Emission characteristics and stability of a helium field ion source," J. Vacuum Science & Tech., 6(3):937-940, (1988).
Karpowicz and Surma, "High-field microscopy of the tungsten/polyethylene system," Surface Science, 213(2,3):393-411, (1989).
Rendulic, "Field ionization of gas mixtures," Surface Science, 47(2):440-444, (1975).

(Continued)

*Primary Examiner* — Phillip A Johnston
(74) *Attorney, Agent, or Firm* — Fish & Richardson P.C.

(57) ABSTRACT

Ion microscope methods and systems are disclosed. In general, the systems and methods provide high ion beam stability.

26 Claims, 16 Drawing Sheets

(56) References Cited

OTHER PUBLICATIONS

Livengood et al., "Helium ion microscope invasiveness and imaging study for semiconductor applications," J. Vac. Sci. Technolog., 25(6):2547-2552, (2007).

Yukinori et al., "Fluorine Field Ion Source Using Fluorine-Helium Gas Mixture," J. Vac. Sci. and Tech., 9(1):51-56, (1991).
International Search Report and Written Opinion for corresponding PCT Application No. PCT/US2009/055127, dated Apr. 1, 2010.
International Preliminary Report on Patentability for corresponding PCT Application No. PCT/US2009/022127, dated Mar. 1, 2011.

* cited by examiner

ION BEAM STABILIZATION

CROSS-REFERENCE TO RELATED APPLICATION

This application is a divisional of, and claims priority under 35 U.S.C. §120 to, U.S. Ser. No. 12/548,764, filed Aug. 27, 2009, now U.S. Pat. No. 8,093,563, which, in turn, claims priority under 35 U.S.C. §119(e)(1) to U.S. Ser. No. 61/093,064, filed Aug. 29, 2008. The entire contents of these applications are incorporated herein by reference.

TECHNICAL FIELD

This disclosure generally relates to ion microscope methods and systems, including such systems and methods that provide relatively high ion beam stability.

BACKGROUND

Ions can be used to investigate and/or modify a sample.

SUMMARY

This disclosure generally relates to ion microscope methods and systems, including such systems and methods that provide relatively high ion beam stability.

Relatively high stability can be manifested, for example, in a relatively high ion beam current stability over a given period of time. In such instances, when using the ion beam to modify a sample (e.g., gas assisted etching, gas assisted deposition, sputtering, exposing photoresist) relatively high ion beam stability can result in increased confidence in the quality and/or uniformity (e.g., site to site) of the sample, and/or reduced cost associated with sample modification. Typically, fluctuations in the ion beam current result in fluctuations in number of ions impinging on the sample per unit time. But, in general, it can be difficult to try to correct for such fluctuations during sample modification, so in many processes each site to be modified is exposed to the ion beam for the same period of time on the assumption that ion beam fluctuations will be within an acceptable level so that sample modification will be relatively uniform from site to site. When the ion beam fluctuates too much, however, the sample can vary from site to site to a degree that is not acceptable (e.g., because the sample will not perform as designed).

Relatively high ion beam stability can also result in increased confidence in the data collected when investigating a sample, increased efficiency of data collection, and/or reduced cost associated with data collection. It is often the case that, when inspecting a sample, fluctuations in the beam current result in fluctuations in number of particles (e.g., secondary electrons) detected from the sample. Such fluctuations in the beam current may occur within a relatively short time frame (e.g., the phenomenon commonly referred to as beam flicker) or may occur over a relatively long time frame (e.g., beam current drift). In either case, fluctuations in the beam current can, for example, make it difficult to determine whether a change in the number of particles detected is due to a local change in the sample (e.g., change in sample surface morphology, change in material present at or near the surface of the sample) or to a change in the ion beam current. In such instances, the data collected (e.g., sample image, sample spectrum) may be considered too unreliable to rely on, and the sample may need to inspected one or more additional times in order to collect sufficiently reliable data. In some cases, the beam current may be too unstable to be used to reliably inspect a sample. Further, repeated attempts to collect data during sample inspection slows down the ability to inspect a given sample. It is conceivable that, in some cases, appropriate throughput of sample inspection cannot be achieved. Moreover, even when repeated inspections of a given sample can be used to collect sufficiently reliable data, the cost associated with this approach may be beyond that which can be tolerated.

Alternatively or additionally, relatively high stability can be manifested, for example, in an ion beam source having a tip that operates for a relatively long period of time with little, if any, of the period of time being spent rebuilding and/or replacing the ion source. This can be beneficial, for example, when using the ions to modify a sample (e.g., a mask). As an example, in such instances, it may be desirable to use the ion beam to sputter a sample. Using an ion beam source with a tip that can operate for a relatively long period of time with little, if any, time spent rebuilding and/or replacing the tip can result in, for example, increased efficiency, and/or reduced cost. This can be advantageous, for example, when it is particularly important to modify a sample with high precision, when a sample is relatively expensive, and/or when a relatively large number of samples is to be processed. In cases where high precision is relevant, potential problems associated with rebuilding and/or replacing the tip (e.g., exposure to various gas conditions, possibly even including exposure of the sample to atmospheric conditions) can be reduced and possibly eliminated if the ion source can be operated for relatively long periods of time without being rebuilt or replaced. Similar advantages can be provided in cases where the sample is relatively expensive. When it is desired to process a relatively large number of samples, being able to use a tip for a relatively long period of time with a relatively small amount of the time being spent rebuilding and/or replacing the tip means that more time is spent processing samples, which generally enhances the throughput of the process.

For sample investigation and/or modification, there is often a strong benefit to having an ion beam with a small virtual source size, low angular divergence, and a low energy spread. The small virtual source size and low angular divergence can allow the beam to be focused to a small probe size on the specimen using conventional ion optical methods. These two desirable characteristics are generally desirable for a low etendue and/or high brightness source of charged particles. The low energy spread can assist in reducing the dispersion or chromatic aberrations introduced from any subsequent ion optical elements.

In some embodiments, a relatively stable ion beam can be achieved by operating the gas field ion microscope above its best imaging field and/or best imaging voltage. As referred to herein, "best imaging field" (BIF) means the magnitude of the electric field applied to the tip of the source that produces the maximum angular emission of ions from the tip of the source (current per solid angle), and the "best imaging voltage" (BIV) means the voltage of the tip of the source used to establish the best imaging field relative to the voltage of the extractor. While operating under such conditions leads to less than the maximum angular emission of ions from the tip of the source, Applicants have discovered that these operating conditions result in reduced current fluctuations, which can overall be more important than high angular emission of ions from the tip of the source.

In certain embodiments, a relatively stable ion beam can be achieved by introducing a second gas with a relatively high BIV (or BIF) during source tip re-forming. As an example, when re-forming a source tip for a neon gas field ion microscope, helium can be introduced. This approach can allow the operator to re-form the tip at a relatively high source tip voltage (field), under which conditions the ion beam created by the first gas (e.g., neon) would be difficult to observe, but under which circumstances an ion beam created by the second gas (e.g., helium) can be observed. After the source tip is re-built, the second gas (e.g., helium) can be removed, and operation with the first gas (e.g., neon) can be resumed.

In some embodiments, a relatively stable switching of ion beams between two gases having different BIVs or BIFs can be achieved by manipulating the field at the tip of the ion source. For example, a relatively low field at the tip of the ion source can be used to form an ion beam composed primarily of ions the lower BIV or BIF gas (e.g., neon ions), and a relatively high field at the tip of the ion source can be used to form an ion beam composed primarily of ions of the higher BIV or BIF gas (e.g., helium ions).

In certain embodiments, a relatively stable switching of ion beams between two different gases can be achieved using a beam separator, such as an electric field, a magnetic field, or both. For example, the beam separator can be arranged in the ion optics and can be switched between a first mode in which the beam separator is configured to allow ions of a first gas to reach a sample while substantially preventing ions of a second gas from reaching the sample, and a second mode in which the beam separator is configured to allow ions of the second gas to reach a sample while substantially preventing ions of the first gas from reaching the sample.

In some embodiments, a relatively high beam stability can be provided, for example, by deliberately introducing a second gas when forming an ion beam of a first gas. Certain characteristics of an ion beam (e.g., virtual source size, angular divergence, energy spread) can be reduced by introducing a second gas when forming an ion beam of a first gas. In a sample of the gas mixture present in the area of the gas field ion microscope where the ion beam is formed, the amount of the second gas is higher than would be present if the second gas were not deliberately added (e.g., the second gas is present in an amount beyond its impurity concentration in the first gas). Optionally, after formation of the ion beam, some (e.g., substantially all) of the second gas can be removed from the ion beam. Thus, in some embodiments, the amount of the second gas in a sample of the gas mixture adjacent the sample can be substantially less than the amount of the second gas present in the area of the gas field ion microscope where the ion beam is formed. Typically, both the first and second gases are noble gases, but in some instances one or both of the gases can be a non-noble gas, such as, for example, molecular hydrogen gas. Often, the second gas is He, and the first gas is a different noble gas (e.g., Ar, Kr, Ne, Xe, Rn). In some instances, the first gas can be Ne and the second gas can be He. In such instances, the Ne ions can be used, for example, to sputter a sample.

In one aspect, the disclosure features a method that includes forming an ion beam using a gas field ion source having a tip operating at voltage that is at least 5% greater than a best imaging voltage for the gas, and using the ion beam to investigate and/or modify a sample.

The voltage of the tip of the gas field ion source can be at least 10% (e.g., at least 15%, at least 20%, at least 30%) greater than the best imaging voltage for the gas. For example, the voltage of the tip of the gas field ion source can be from 10% to 20% greater than the best imaging voltage for the gas.

The gas field ion source can have a tip that includes a terminal shelf with a trimer that generates the ion beam.

The gas field ion source can have a tip that generates the ion beam, and motion of atoms at the tip of the gas field ion source is reduced by a factor of at least two relative to motion of the atoms at the tip of the gas field ion source when operating at the best imaging voltage.

The gas field ion source has a tip that generates the ion beam, and emission of ions per site at the tip of the gas field ion source is reduced by a factor of at least two relative to emission of ions per site at the tip of the gas field ion source when operating at the best imaging voltage.

The gas can be a noble gas, such as neon.

The gas field ion source can be part of a gas field ion microscope.

In another aspect, the disclosure features a method that includes: a) using a first gas to produce a beam of ions from a gas field ion source to investigate and/or modify a sample; and b) after a), while re-forming a tip of the gas field ion source, monitoring an atomic structure of a terminal shelf of the tip of the gas field ion source by using a second gas to produce an emission pattern of the terminal shelf of the tip of the gas field ion source. The second gas can be different from the first gas.

The information for the beam of ions of the second gas generated by the gas field ion source can be an image of the tip of the gas field ion source.

The gas field ion source can operate at a first voltage during a), the gas field ion source operates at a second voltage during b), and the first voltage is different from the second voltage.

The second voltage can be greater than the first voltage.

The method can also include: c) after b), using the first gas to produce a beam of ions from a gas field ion source to investigate and/or modify a sample.

The gas field ion source can operate at a first voltage during a), the gas field ion source can operate at a second voltage during b), and the gas field ion source can operates at a third voltage during c). The first voltage can be different from the second voltage, and the third voltage can be different from the second voltage.

The second gas can be helium.

The first gas can be a noble gas.

Both the first and second gases can interact with the gas field ion source during a).

Both the first and second gases can interact with the gas field ion source during b).

At a given voltage of the tip of the gas field ion source, the best imaging voltage of the first gas can be less than the best imaging voltage of the second gas. For example, the best imaging voltage of the second gas is at least 10% greater (e.g., 20% greater, 30% greater, 40% greater) than the best imaging voltage of the first gas.

The gas field ion source can operate at a first field during a), the gas field ion source can operate at a second field during b). The first field can be different from the second field.

In a further aspect, the disclosure features a method that includes: using a gas field ion source to generate a first ion beam including ions of a first gas and ions of a second gas different from the first gas; and separating the first ion beam into a second beam and a third ion beam. The first ion beam include at least 10% ions of the first gas and at most 1% ions of the second gas. The second ion beam includes at least 10% ions of the second gas and at most 1% ions of the first gas.

The method can further include imaging a tip of the gas field ion source using the first and second ion beams.

The method can further include simultaneously interacting the second and third ion beams with a sample to investigate and/or modify the sample.

The method can further include exposing the gas field ion source to atoms of both the first gas and the second gas to generate the first ion beam.

The pressure of the first gas can be at most four times a pressure of the second gas, and/or the pressure of the first gas can be at least 0.25 times the pressure of the second gas.

The first gas can be a first noble gas.

The second gas can be a second noble gas.

The second ion beam can include at least 25% ions of the first gas.

The third ion beam can include at least 25% ions of the second gas.

The second ion beam can include at most 0.1% ions of the second gas.

The third ion beam can include at most 0.1% ions of the first gas.

The method can include using an ion beam separator including a magnetic field source to separate the first ion beam into the second and third ion beams. The ion beam separator can include a combination of magnetic and electric fields.

The first ion beam can include ions different isotopes of an atom, the second ion beam can include ions of a first isotope of the atom, and the third ion beam can include ions of a second isotope of the atom.

In an additional aspect, the disclosure features a system that includes: a gas field ion source capable of generating a first ion beam including ions with different masses; and an ion beam separator configured so that during use of the system the ion beam separator separates ions in the first ion beam into second and third ion beams. The second ion beam includes at least 10% ions of a first mass and at most 1% ions of a second mass different from the first mass, and the third ion beam includes at least 10% ions of the second mass and at most 1% ions of the first mass.

The ion beam separator can separate the first ion beam into the second and third ion beams based on at least one parameter selected from ion mass, ion charge and/or ion velocity.

The system can include ion optics configured to direct ions from the gas field ion source to a sample during use of the system, and the ion optics can include the ion beam separator. The ion optics further can include an aperture. During use of the system, the second ion beam can pass through the aperture. During use of the system, the third ion beam may not pass through the aperture. For example, during use of the system, the third ion beam may be blocked by the aperture.

The ion beam separator can include an electric field source and/or a magnetic field source. The ion beam separator can be capable of generating a magnetic field and an electric field.

The ion beam separator can separate ion beams of the same atoms, but of different isotopic masses.

The system can be a gas field ion microscope.

In one aspect, the disclosure provides a method that includes forming an ion beam using a gas field ion source while exposing the gas field ion source to a gas mixture including at least 80% of a first gas and at most 20% of a second gas that is different from the first gas.

The gas mixture can include at least 90% of the first gas.

The gases can both be noble gases.

The first gas can be helium.

The second gas can be neon.

The ion beam can have a current at a sample that changes by less than 10% during a period of time that is at least 30 seconds.

The gas field ion source can have a duty cycle of at least 90% for a time period of at least one day.

The presence of the second gas can allow the system to run at a lower operating voltage.

The presence of the second gas can allow the system to produce an ion beam with an angular current density that is increased by at least 20%.

The presence of the second gas can allow the system to produce an ion beam with an energy spread that is reduced by at least 20%.

The presence of the second gas can allow the system to produce an ion beam with an angular spread that is reduced by at least 20%.

The method can further include using the ion beam to inspect and/or modify a sample.

The presence of the second gas allows can reduce the fluctuations in emission current by 50%.

In another aspect, the disclosure features a method that includes forming an ion beam using a gas field ion source while exposing the gas field ion source to a gas mixture including helium and neon. The gas mixture includes from 0.1% to 10% helium, and the gas mixture includes at least 10% neon.

The ion beam can have a current at a sample that changes by less than 10% during a period of time that is at least 30 seconds.

The gas field ion source can have a duty cycle of at least 90% for a time period of at least one day.

The method can further include using the ion beam to inspect and/or modify a sample.

In a further aspect, the disclosure features a method that includes using a gas field ion source to form an ion beam having a current at a sample that changes by less than 10% during a period of time that is at least 30 seconds. The ion beam include at least 0.1% of a first noble gas and at least 10% of a second noble gas that is different from the first noble gas.

The first noble gas can be He.

The method can further include using the ion beam to inspect and/or modify a sample.

In an additional aspect, the method includes using a gas field ion source to form an ion beam with a duty cycle of at least 90% for a time period of at least one day. The ion beam includes at least 0.1% of a first noble gas and at least 10% of a second noble gas that is different from the first noble gas.

The first noble gas can be He.

The method can further include using the ion beam to inspect and/or modify a sample.

In an additional aspect, the disclosure features a method that includes determining a desired ion beam stability of a gas field ion source, and, based on the desired ion beam stability, determining a gas mixture including at least two different noble gases to form an ion beam using the gas field ion source.

The desired ion beam stability can be measured as an ion beam current at a sample that changes by less than a predetermined amount during a predetermined period of time.

The method can further include using the ion beam to inspect and/or modify a sample.

In one aspect, the disclosure features a method that includes determining a desired duty cycle of a gas field ion source, and, based on the desired duty cycle of the gas field ion source, determining a gas mixture including at least two different noble gases to form an ion beam using the gas field ion source.

The can further include using the ion beam to inspect and/or modify a sample.

In another aspect, the disclosure features a method that includes forming an ion beam that includes ions of different gases by exposing a gas field ion source to a gas mixture including the different gases. The method also includes selecting an electric field at a tip of the gas field ion source based on a desired relative abundance of ions within the ion beam.

Reducing the field at the tip of the gas field ion source can increase an abundance of lower mass ions within the ion beam.

Increasing the field at the tip of the gas field ion source can increase an abundance of higher mass ions within the ion beam.

The electric field at the tip of the gas field ion source can be controlled by the voltages applied the tip of the gas field ion source, an extractor, and/or a suppressor.

The gas mixture can include helium and a heavier gas. For example, the gas mixture can include helium and neon.

The electric field can be switched between a first value and a second value different from the first value. The ion beam which can be greater than 80% helium when using the first value of the electric field. Three ion beam which can be at least 20% neon when using the second value of the electric field.

The method can further include operating the gas field ion source to generate the ion beam.

The above-mentioned features and those to be explained below can be used not only in the specified combinations, but also in other combinations or on their own without departing from the scope of the disclosure.

Other features and advantages will be apparent from the description, drawings, and claims.

DETAILED DESCRIPTION

Introduction

Figure 1:
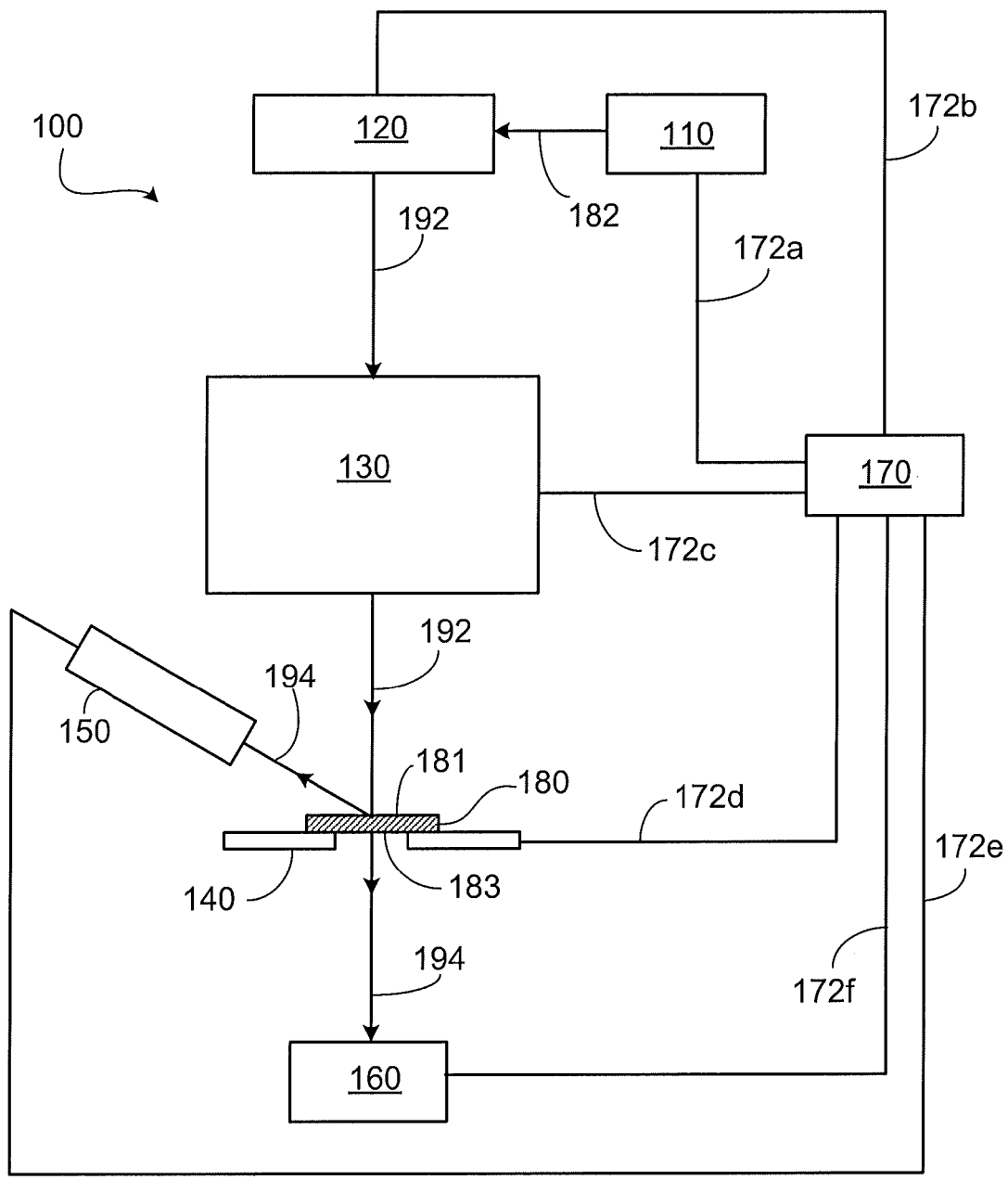
FIG. 1 is schematic diagram of an ion microscope system.
Figure 2:
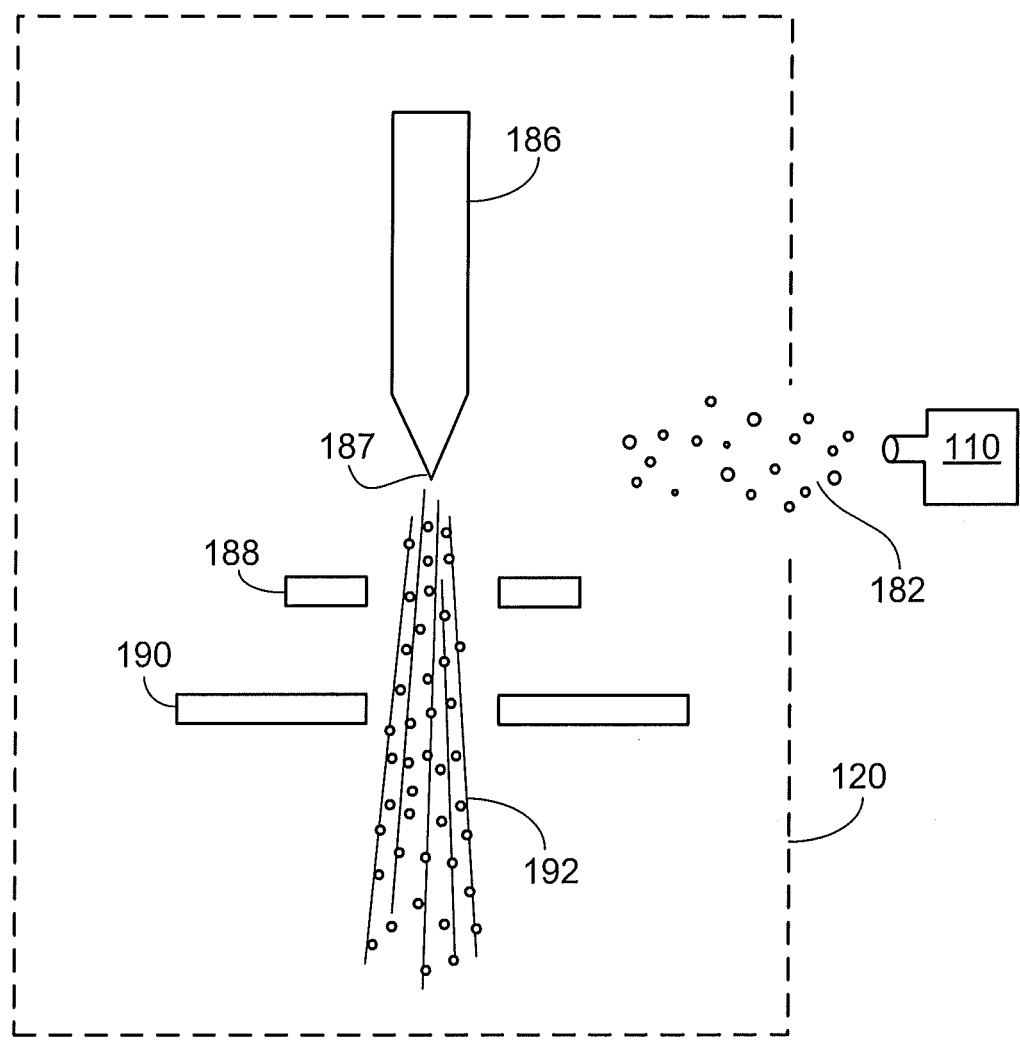
FIG. 2 is a schematic diagram of a gas field ion source.
Figure 6:
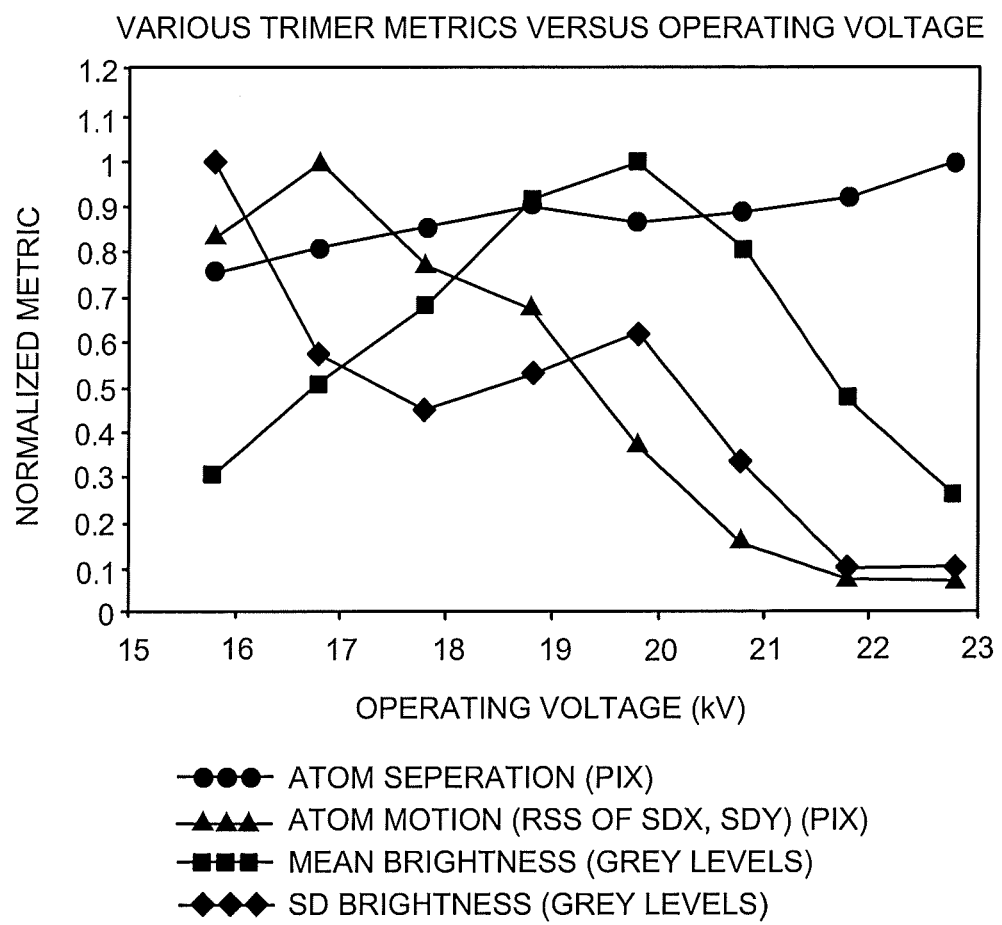
FIG. 6 is a graph of certain metrics of performance versus the operating voltage, where it is shown that, although the peak brightness is attained at the BIV (19.8 kV), operating at higher voltages such as 21.8 kV (about half as much current as attained at BIV) produces reduced atom motion and increased brightness stability.

FIG. 1 shows a schematic, representation of a gas field ion microscope system 100 that includes a gas source 110, a gas field ion source 120, ion optics 130, a sample manipulator 140, a front-side detector 150, a back-side detector 160, and an electronic control system 170 (e.g., an electronic processor, such as a computer) electrically connected to various components of system 100 via communication lines 172a-172f. A sample 180 is positioned in/on sample manipulator 140 between ion optics 130 and detectors 150, 160. During use, an ion beam 192 is directed through ion optics 130 to a surface 181 of sample 180, and particles 194 resulting from the interaction of ion beam 192 with sample 180 are measured by detectors 150 and/or 160. In general, it is desirable to reduce the presence of certain undesirable chemical species in system 100 by evacuating the system. As shown in FIG. 2, gas source 110 is configured to supply one or more gases (e.g., He, Ne, Ar, Kr, Xe, Rn) 182 to gas field ion source 120. Gas field ion source 120 is configured to receive the one or more gases 182 from gas source 110 and to produce gas ions from gas(es) 182. Gas field ion source 120 includes a tip 186 with a tip apex 187, an extractor 190 and optionally a suppressor 188. During use, tip 186 is biased positively with respect to extractor 190, extractor 190 is negatively or positively biased with respect to an external ground, and optional suppressor 188 is biased positively or negatively with respect to tip 186. With this configuration, un-ionized gas atoms 182 supplied by gas source 110 are ionized and become positively-charged ions in the vicinity of tip apex 187. The positively-charged ions are simultaneously repelled by positively charged tip 186 and attracted by negatively charged extractor 190 such that the positively-charged ions are directed from tip 186 into ion optics 130 as ion beam 192. Suppressor 188 assists in controlling the overall electric field between tip 186 and extractor 190 and, therefore, the trajectories of the positively-charged ions from tip 186 to ion optics 130. In general, the overall electric field between tip 186 and extractor 190 can be adjusted to control the rate at which positively-charged ions are produced at tip apex 187, and the efficiency with which the positively-charged ions are transported from tip 186 to ion optics 130. In general, ion optics 130 are configured to direct ion beam 192 onto surface 181 of sample 180. Ion optics 130 can, for example, focus, collimate, deflect, accelerate, and/or decelerate ions in beam 192. Ion optics 130 can also allow only a portion of the ions in ion beam 192 to pass through ion optics 130. Generally, ion optics 130 include a variety of electrostatic, magnetostatic, and other ion optical elements that are configured as desired. By manipulating the electric and magnetic field strengths of one or more components (e.g., electrostatic deflectors) in ion optics 130, He ion beam 192 can be scanned across surface 181 of sample 180. For example, ion optics 130 can include two deflectors that deflect ion beam 192 in two orthogonal directions. The deflectors can have varying electric field strengths such that ion beam 192 is rastered across a region of surface 181. When ion beam 192 impinges on sample 180, a variety of different types of particles 194 can be produced. These particles include, for example, secondary electrons, Auger electrons, secondary ions, secondary neutral particles, primary neutral particles, scattered ions and photons (e.g., X-ray photons, IR photons, visible photons, UV photons). Detectors 150 and 160 are positioned and configured to each measure one or more different types of particles resulting from the interaction between He ion beam 192 and sample 180. As shown in FIG. 6, detector 150 is positioned to detect particles 194 that originate primarily from surface 181 of sample 180, and detector 160 is positioned to detect particles 194 that emerge primarily from surface 183 of sample 180 (e.g., transmitted particles). In general, a wide variety of different detectors can be employed in microscope system 100 to detect different particles, and a microscope system 100 can typically include any desired number of detectors. The configuration of the various detector(s) can be selected in accordance with particles to be measured and the measurement conditions. Generally, the information measured by the detectors is used to determine information about sample 180. Typically, this information is determined by obtaining one or more images of sample 180. The operation of microscope system 100 is generally controlled via electronic control system 170. For example, electronic control system 170 can be configured to control the gas(es) supplied by gas source 110, the temperature of tip 186, the electrical potential of tip 186, the electrical potential of extractor 190, the electrical potential of suppressor 188, the settings of the components of ion optics 130, the position of sample manipulator 140, and/or the location and settings of detectors 150 and 160. Control system 170 can also be used in the manner described above with regard to controller 180. Optionally, one or more of these parameters may be manually controlled (e.g., via a user interface integral with electronic control system 170). Additionally or alternatively, electronic control system 170 can be used (e.g., via an electronic processor, such as a computer) to analyze the information collected by detectors 150 and 160 and to provide information about sample 180, which can optionally be in the form of an image, a graph, a table, a spreadsheet, or the like. Typically, electronic control system 170 includes a user interface that features a display or other kind of output device, an input device, and a storage medium.

There are a variety of materials from which tip 186 can be formed, and there also various shapes that tip apex 187 can possibly have. As an example, in some embodiments, tip 186 is formed of tungsten (W), and tip apex 187 has a terminal shelf that is a W(111) trimer. In some embodiments, tip 186 is formed of tungsten (W) and has a terminal shelf 187 with an orientation of W(112), W(110) or W(100). In certain embodiments, tip apex 187 can have a terminal shelf with two atoms, four atoms, five atoms, six atoms, seven atoms, eight atoms, nine atoms, ten atoms, and more than ten atoms. In general, tip 186 can be formed of a metal (e.g., tantalum (Ta), iridium (Ir), rhenium (Rh), niobium (Nb), platinum (Pt), molybdenum (Mo)) or an alloy (e.g., alloys of one or more metals disclosed herein). In some embodiments, tip 186 is formed of carbon (C).

Ion microscopes, as well as related components and methods, are described, for example, in U.S. Pat. No. 7,557,359, which is hereby incorporated by reference in its entirety.

Operating above BIV or BIF

In some cases, it can be difficult to attain and/or maintain stable emission current from a gas field ion source. Typically, this results form from fluctuation of the emission properties over time. The emission properties can often include (1) the motion of the emitting sites and (2) the fluctuation in the total emission for a single emitting site.

Figure 3A:
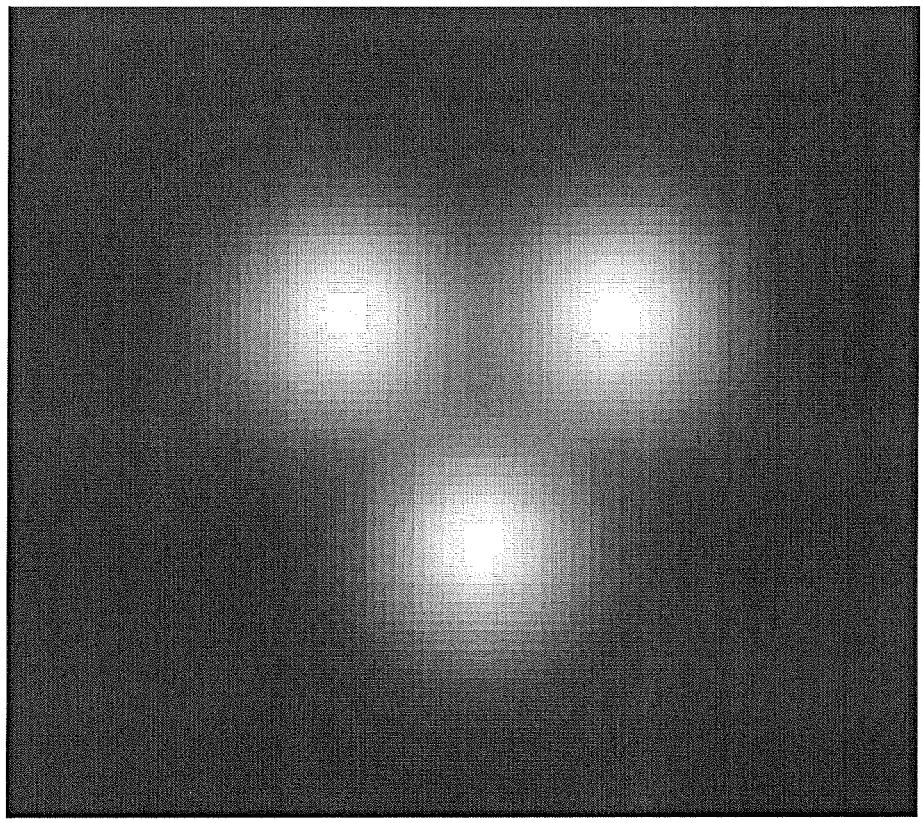
FIGS. 3A-3C show emission patterns for a nearly perfect equilateral triangle where all the atoms are emitting with equal angular emission current (3A), at a later time one of the atomic sites has moved without the emission having changed (3B), and at a later time when one of the emitting sites has gotten brighter (3C).
Figure 3B:
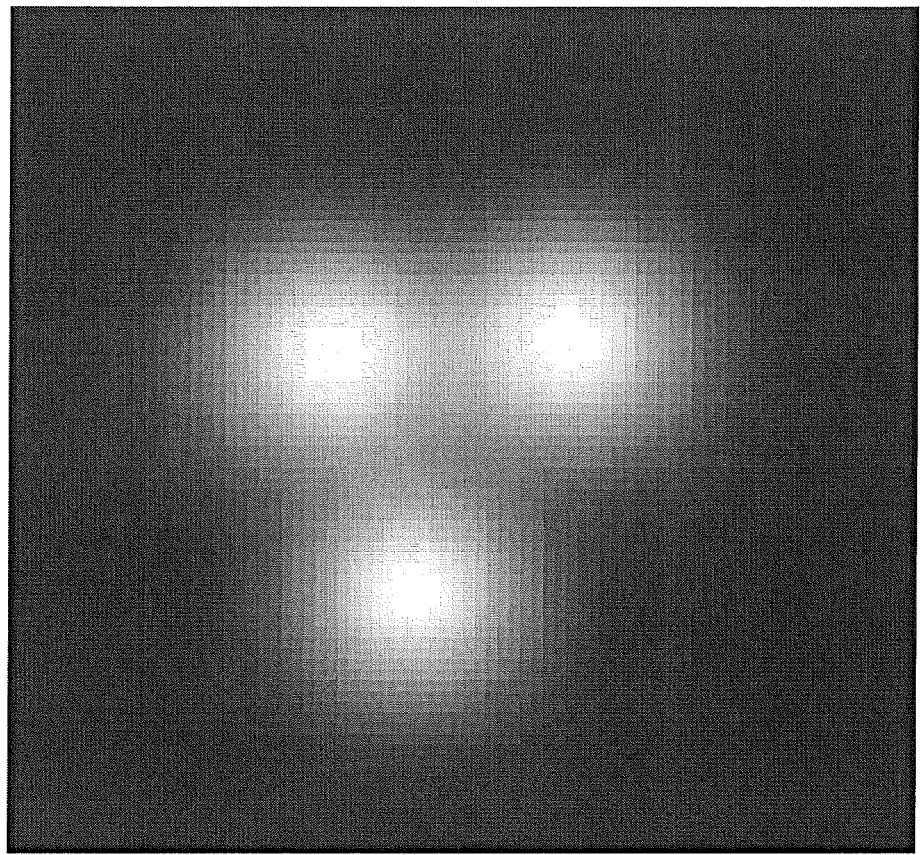
Figure 3C:
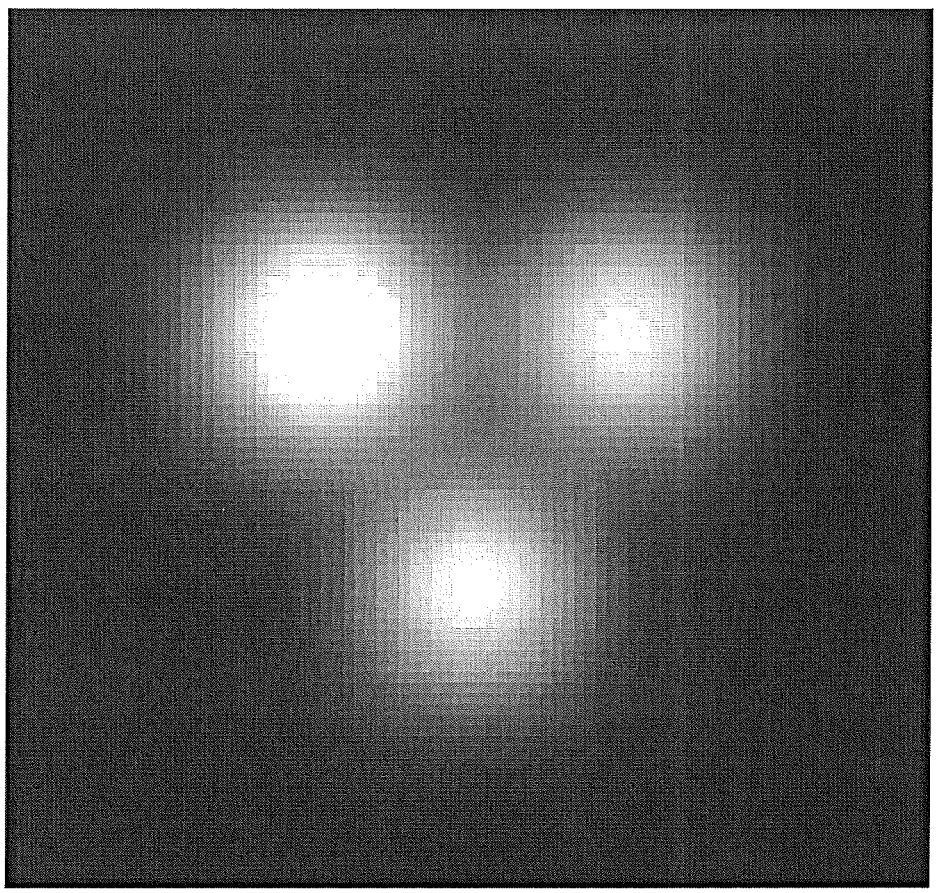

FIGS. 3A-3C demonstrate an example. FIG. 3A shows the initial emission pattern from the tip of a gas field ion source having a terminal shelf that is a W(111) trimer. FIG. 3B shows the emission site some time later when the upper left emitting sites has moved to the right. FIG. 3C shows the emission site some time later when the upper left emitting sites has changed increased its total emission.

Either of effects (1) or (2) noted above can cause fluctuations in the current of ions that reaches the sample. For a gas field ion microscope system used for imaging, such fluctuations in the probe current can lead to undesired artifacts in the image such as dark and light bands, or image drift, or image vibrations, or blurriness, or astigmatism. For a gas field ion microscope used for sputtering or milling of a sample, the fluctuations in the probe current can lead to non-uniform removal of material. For a gas field ion microscope used for beam induced chemistry, the etching or deposition pattern will lack the desired fidelity.

Conventionally, the electric field is established to maximize the angular emission (current per solid angle) to produce the brightest field ion microscope (FIM) or scanning field ion microscope (SFIM) image. In other words, the gas field ion microscope is typically operated at the BIV or BIF. However, it has been discovered that operating above the BIV or BIF substantially reduces the probe current fluctuations. It is believed that this technique addresses issues resulting from both (1) and (2) noted above. While operating above BIV or BIF reduces angular current density (e.g., half of maximum current), the emission current is much more stable over time. Often, this advantage can be more valuable than the reduction in emission current.

Figure 4A:
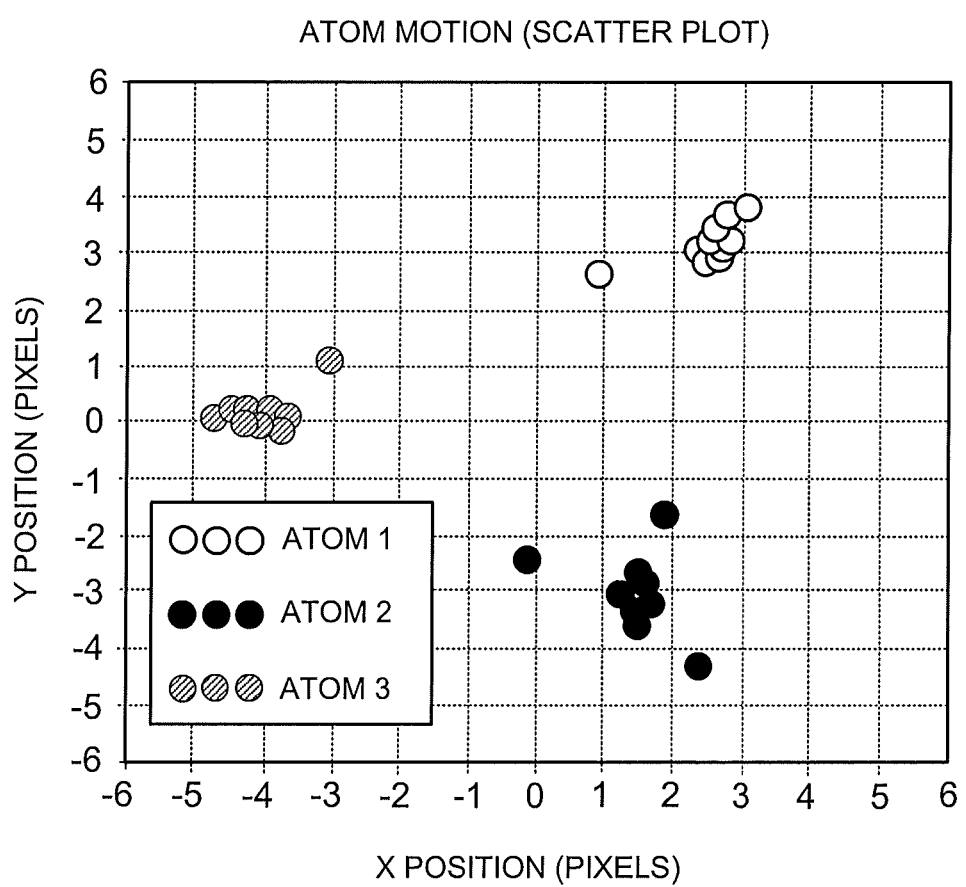
FIGS. 4A and 4B show emitting site motion versus time at BIV (4A) and above BIV (4B), where the dots represent the individual atoms of the trimer and the x,y position of an emitting site is recorded with a camera with a fresh frame rate of approximately 10 Hz.

FIGS. 4A-6 show data a He gas field ion system having a tungsten ion source with a tip apex formed of a terminal shelf having a W(111) trimer. Under these circumstances the BIV for He is 19.8 kV. FIG. 4A shows the motion of the three single atomic emission sites versus time when operating at BIV, where the data were collected using a FIM. FIG. 4B shows the motion of the three single atomic emission sites versus time when operating at 114% of BIV, where the data were collected using a FIM. FIG. 5A shows the emission current versus time for a single atomic emission site when operating at BIV, where the data were collected using a FIM. FIG. 5B shows the emission current versus time for a single atomic emission site when operating at 114% of BIV, where the data were collected using a FIM. FIG. 6 shows the average emission current reduction as a function of the voltage of the ion source relative to the extractor for He, where the data were collected using a FIM. Note that all of these images were acquired with a FIM, and the brightness was calibrated using a pico-ammeter. While the foregoing uses FIM, in some embodiments, SFIM could have been used.

The FIM is constructed by standard all metal UHV techniques as can be found in the literature (for example see Journal of Scientific Instruments, 1965, Vol 42, "An All-Metal Field Ion Microscope"). The FIM was operated with a base pressure of $1 \times 10^{-8}$ Ton. Helium was admitted to produce an operating pressure of $5 \times 10^{-5}$ Ton. The helium gas and the emitter were admitted with a temperature of about 78 Kelvin. The emitter had a conical tip with a shank half angle of 21 degrees, and terminated in a spherical end-form with an average radius of curvature of 120 nm. The tip was located about 3 mm from a concentric extractor which had a opening of diameter 3 mm through which the beam passed. The beam proceeded another 65 mm before striking a MCP type image intensifier (El Mul model dc175/1). The resulting optical image was viewed with a high performance optical camera (AVT Guppy F-038B NIR). The resulting video was captured by software developed in-house expressly for this purpose. The video was then analyzed frame by frame using the "ImageJ" software.

As shown in the figures, operating above BIV (or BIF) can enhance the stability of the ion beam generated by a gas field ion source. In certain embodiments, a beam of ions of a gas can be generated using a tip of a gas field ion source that is operated at voltage that is at least 5% greater (e.g., at least 10% greater, at least 15% greater, at least 20% greater) than the BIV (or BIF) for the gas. In some embodiments, a beam of ions of a gas can be generated using a tip of a gas field ion source that is operated at voltage that is at most 30% greater of the BIV (or BIF) for the gas. In certain embodiments, a beam of ions of a gas can be generated using a tip of a gas field ion source that is operated at a voltage that is from 5% to 30% (e.g., from 10% to 20%) greater than the BIV or (BIF) for the gas.

Figure 4B:
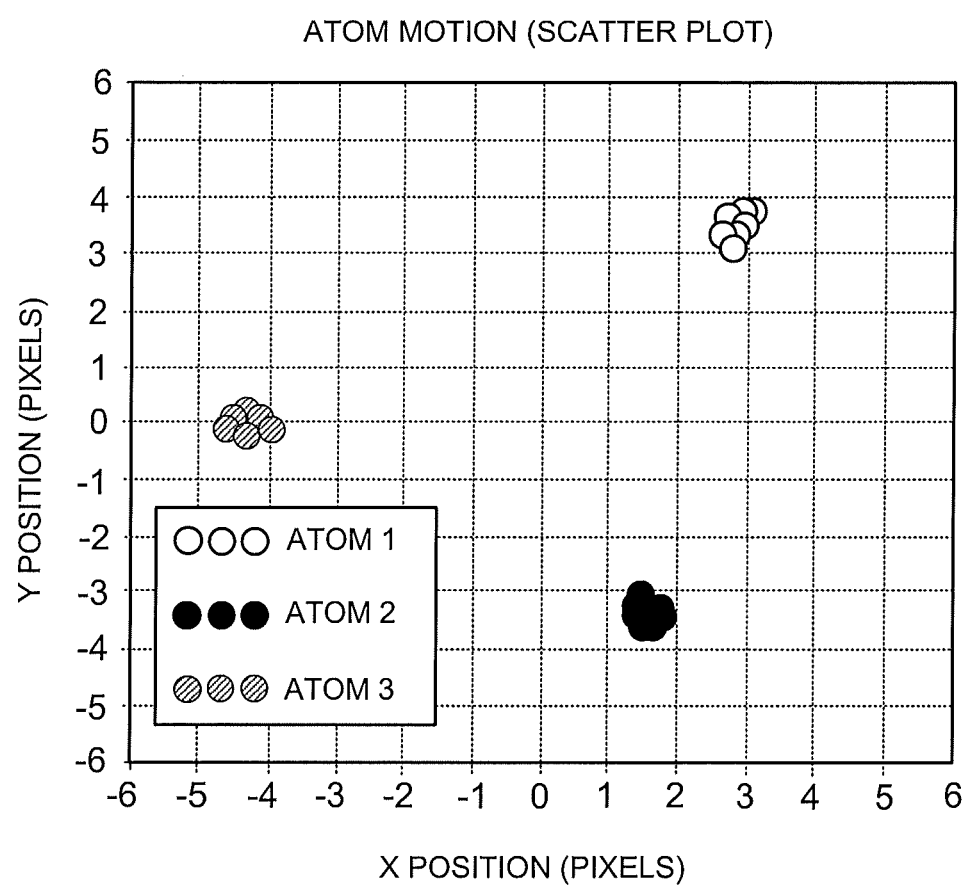

As shown in the FIGS. 4A, 4B, and 6, operating above BIV (or BIF) can reduce the motion of the emitting sites at the tip apex. In some embodiments, the amount of motion of the emitting sites at the tip apex is reduced by a factor of at least two (e.g., at least five, at least 10) when operating above BIV (or BIF) relative to the amount of motion of the emitting sites at the tip apex when operating at BIV (or BIF). As used herein, the amount of motion of an emitting site is measured as the combined standard deviation of the x and y positions of the emitting site over time.

Figure 5A:
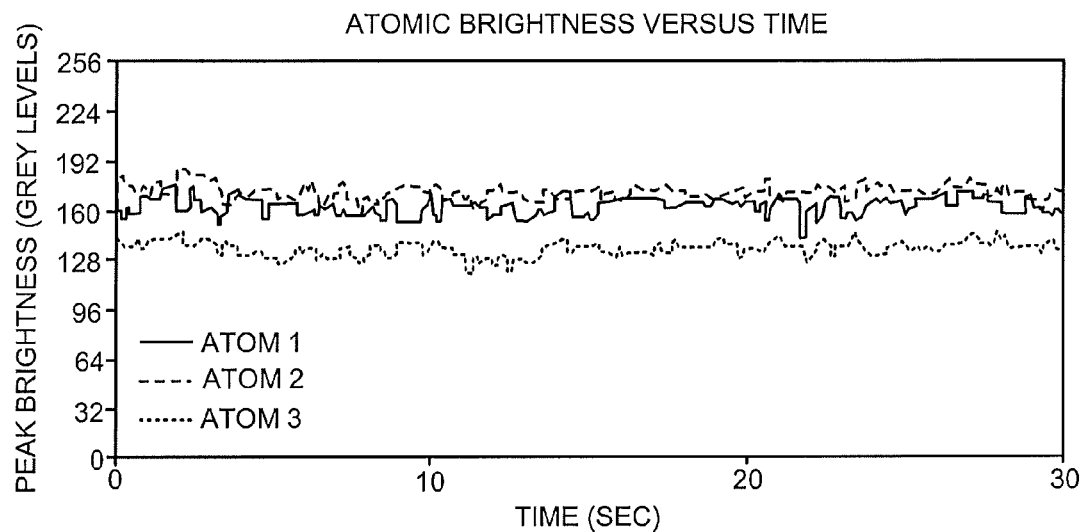
FIGS. 5A and 5B show emission current versus time for emitting site at BIV (5A) and above BIV (5B), where the traces represent the emission current for each emitting site.
Figure 5B:
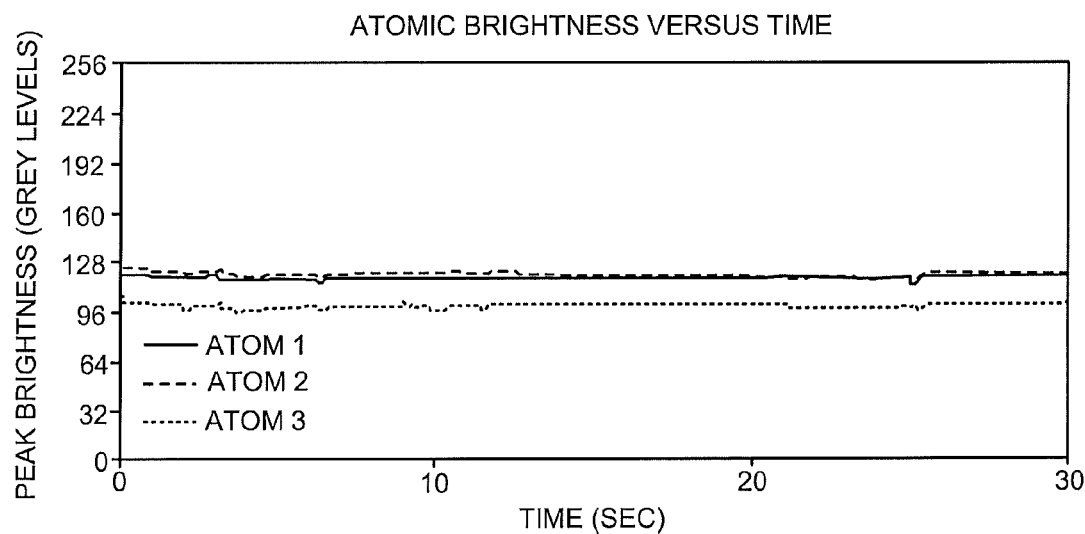

As shown in the FIGS. 5A, 5B, 6, operating above BIV (or BIF) can reduce fluctuations in the emission current of an emitting site at the tip apex. In some embodiments, the amount of fluctuation in the emission of an emitting site at the tip apex is reduced by a factor of at least two (e.g., at least five, at least 10) when operating above BIV (or BIF) relative to the amount of fluctuation in the emission of an emitting site at the tip apex when operating at BIV (or BIF). As used herein, the amount of fluctuation in the emission of an emitting site is measured as the standard deviation of the emission of the emitting site over time.

Introducing a Relatively High BIV or BIF Gas During Source Tip Re-Forming

Generally, a gas field ion microscope system is operated using a single gas. Typically, for imaging applications, the microscope operates with the lightest possible noble gas atom, helium. For other applications such as sputtering, beam assisted chemical deposition, beam assisted chemical etching, or ion implantation, other gases can be used. Neon is a common choice in these applications.

In general, the quality of the ion beam formed by ion source 110 depends in part on the shape of tip apex 187. Often, after using tip 186 for a period of time, the quality of the ion beam can decrease due to deformation of tip apex 187, making it desirable to re-form the tip apex 187 to a shape that will provide desired improvements to the ion beam properties. In general, re-forming tip apex 187 is done by process that includes field evaporating one or more atoms from tip apex 187. Field evaporation can be achieved by increasing the electric field at tip apex 187 up to a level of about 5 V/angstrom, where the atoms are field evaporated from tip apex 187 one by one. It is generally desirable to carefully monitor the field evaporation process (e.g., via a FIM image or a SFIM image) to ensure that undesired atoms are removed from tip apex 187 and the emission from tip apex 187 assumes a desired pattern (e.g., a trimer).

Figure 7:
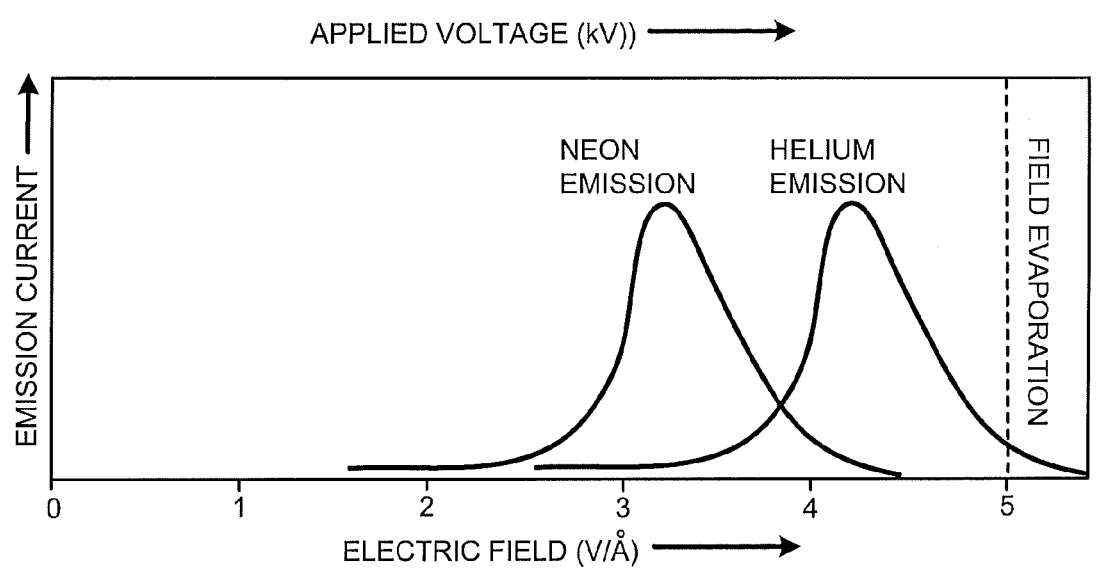
FIG. 7 shows the electric field and applied voltages and the emission currents the produce for helium and neon.

Depending on the gas being used, it can be difficult to obtain a FIM image or SFIM at the fields typically used for field evaporation because the emission current of ions of the gas generated by the ion source may be very low at these fields. For example, referring to FIG. 7, the emission current of neon ions (BIF of about 3.3 V/angstrom) is very low at 5 V/angstrom, which is a typical value for the field used during field evaporation. Not being able to use a neon ion beam to adequately monitor tip re-forming would potentially present a serious obstacle to the practical use of neon gas in a gas field ion source.

This problem can be overcome by temporarily introducing helium gas into the gas field ion microscope system, where the helium is to be used to re-form the tip apex of the gas field ion source. Again referring to FIG. 7, it can be seen that the emission current of helium ions (BIF of about 4.4 V/angstrom) is sufficiently large so that, even at a field of 5V/angstrom, the helium ion emission can be used to produce a FIM image or a SFIM image during tip apex re-forming.

Thus, in some embodiments, a neon ion beam can be generated using a gas field ion source. The neon ion beam can be used to investigate (e.g., image) a sample and/or modify a sample (e.g., sputter material from the sample, perform neon ion beam assisted chemical deposition of a material on the sample, perform beam assisted chemical etching of a material from the sample, deposit neon ions in the sample). When appropriate, the tip apex of the gas field ion source can be re-formed by introducing helium into the system and using the resulting helium ion beam to image the tip apex during tip apex re-forming. After the tip apex is re-formed, the helium can be removed from the system, and a neon ion beam can again be used to investigate and/or modify the sample. The neon gas delivery can persist when the helium is introduced, or the neon gas delivery can be stopped when the helium is introduced. The helium gas delivery can occur during tip re-forming only, or at various other points in the use of the gas field ion source as well.

More generally, a method can include using a beam of ions of a first gas (e.g., neon, argon, krypton, xenon, radon) generated by a gas field ion source operating at a first field or voltage to investigate and/or modify a sample, and subsequently re-forming a tip of the gas field ion source operating at a second field or voltage (different from the first field or voltage) based on information for a beam of ions of a second gas (e.g., helium) generated by the gas field ion source. The information for the beam of ions of the second gas generated by the gas field ion source can be an image (e.g., a FIM image, a SFIM image) of the tip of the gas field ion source. The method can further include, after re-forming the tip, again using a beam of ions of the first gas generated by the gas field ion source operating to investigate and/or modify a sample. Usually, the voltage or field used to form this beam of ions will be about the same as the first voltage or field. In some case, the BIV or BIF is used for the first gas when using ions of the first gas to investigate and/or modify the sample, and the BIV or BIF of the second gas is used when re-forming the tip apex.

In general, at a given voltage of the tip of the gas field ion source, the best imaging voltage of the first gas is less than the best imaging voltage of the second gas. In some embodiments, the best imaging voltage of the second gas is at least 10% greater (e.g., at least 20% greater, at least 30% greater, at least 40% greater, at least 50% greater) than the best imaging voltage of the first gas.

Table I lists BIV and BIF values for certain gases when using a gas field ion microscope system having a tungsten tip with a W(111) tip apex having a terminal shelf that is a trimer.

TABLE I

| Gas | BIV (kV) | BIF (V/angstrom) |
|---|---|---|
| Helium | 19.8 | 4.4 |
| Neon | 13.2 | 3.4 |

TABLE I-continued

| Gas | BIV (kV) | BIF (V/angstrom) |
|---|---|---|
| Argon | 8.6 | 1.9 |
| Krypton | 6.8 | 1.5 |
| Xenon | 5.4 | 1.2 |

Switching Between Beams with a Beam Separator or by Changing the Operating Voltage In some cases, it is desirable to switch between ion beams formed of different gases. For example, it may be desirable to use a helium ion beam to investigate a sample, and a neon ion beam to modify a sample. In many instances, the gas delivery of the gas field ion microscope system cannot be adjusted instantaneously. The flow control system is often some distance away from the point at which the gas is ultimately delivered to the tip apex. Between the flow control system and the point of delivery there may be some volume (from tubing and gauges for example) and some flow restrictions (from nozzles, or purifying filters). Therefore, the gas delivery often cannot respond quickly to changes in the flow control system. This slow response is seen for both turning on a given gas and turning off the given gas. In the transition, there is a period of time (e.g., several seconds, even several minutes) in which the gas delivery is not steady, which can result in undesirable fluctuations in the current of the ion beam of interest.

An illustrative example is as follows. An operator of the gas field ion microscope system begins imaging a sample with a helium beam to minimize damage while navigating to the desired location on the specimen. On locating the region, the operator turns off the helium gas and turns on the neon gas, and waits two minutes. Then the operator uses the neon beam to sputter away regions of the sample that need to be removed. However, to monitor the progress of the sputtering, the operator switches off the neon and turns on the helium, and again waits two minutes. It may be that the operator observes that the sputtering is not yet complete. Accordingly, the operator turns off the helium and turns the neon back on, and waits two minutes. This cycle may be repeated numerous times, resulting in a very time consuming and inefficient process.

The scenario above can be greatly improved upon by simply operating both of the gases as the same time. Both neon and helium can be flowing at the same time. In general, both of these gases can be ionized and produce emission patterns, which in some cases can be very similar.

In some embodiments, the ion source can be operated with multiple gases present and the desired ion beam can be selected by choosing the operating voltage appropriately. Referring again to FIG. 7, it is noted that the neon (W111) trimer emission is maximized for field strengths of 3.3 V/angstrom, and falls off precipitously for higher and lower field strengths, whereas the helium emission is maximized for a field strength of 4.4 V/angstrom and falls off precipitously for higher and lower field strengths. Therefore, the operator can choose an operating field for the tip apex to produce an ion beam formed substantially of neon ions with relatively little helium ions present in the beam (e.g., by using a field of about 3.4 V/angstrom when the tip apex is a W(111) trimer), or the operator can choose an operating field for the tip apex to produce an ion beam formed substantially of helium ions with relatively little neon ions present (e.g., by using a field of about 4.4 V/angstrom when the tip apex is a W(111) trimer). In either of these two cases, the beams can be attained with relatively high purity (more than 80%, more than 90%, more than 95%).

Figure 8:
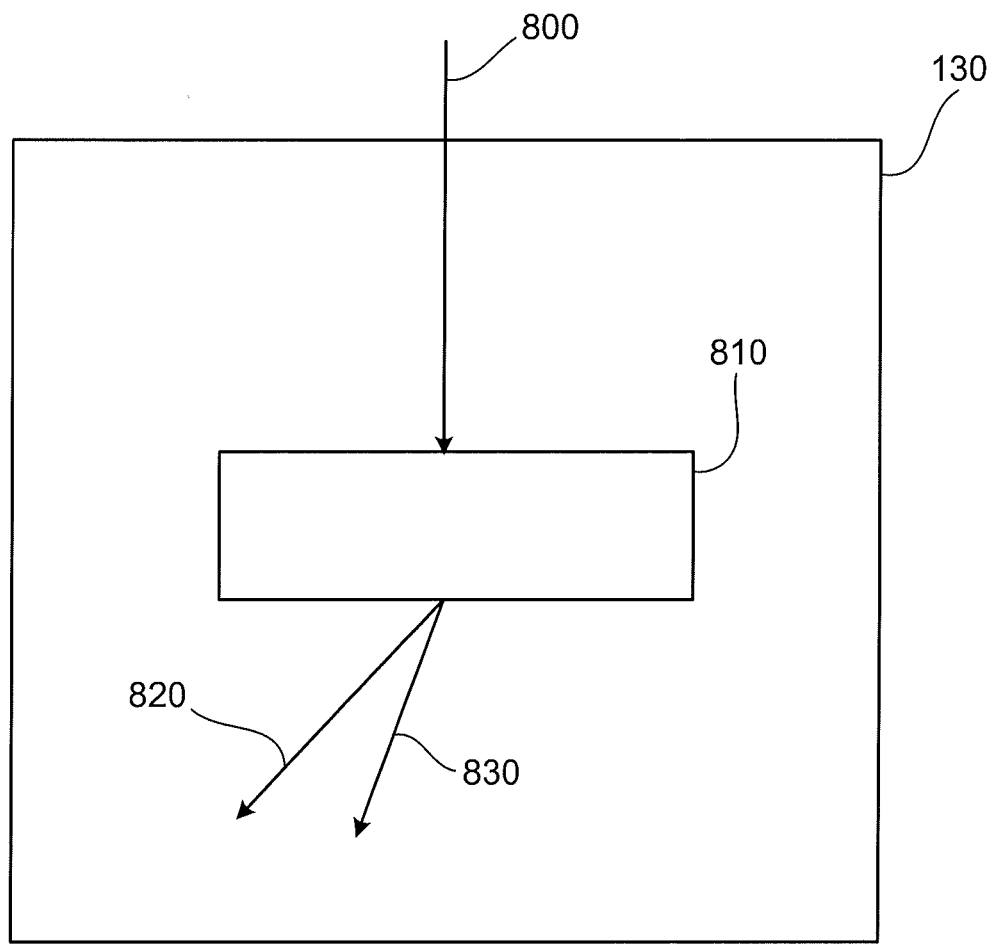
FIG. 8 is a schematic representation of a gas field ion microscope system having a beam separator.

Referring to FIG. 8, in some embodiments, the tip apex may be operated at a field such that an ion beam 800 containing a substantial amount of both helium ions (light component) and neon ions (heavy component) is generated. Ion beam 800 enters a beam separator 810 in ion optics 130. Beam separator 810 separates the helium ions and the neon ions to form two different ion beams 820 and 830, respectively. Ion beam 820 is formed of primarily helium ions, and ion beam 830 is formed primarily of neon ions.

In some embodiments, separator 810 generates a magnetic field which separates beam 800 into beams 820 and 830. The trajectories of the neon ions and helium ions are not substantially influenced by electrostatic fields that might be used for deflection, scanning, or focusing the ion beams in ion optics 130. However, the magnetic field created by beam separator 810 causes the trajectories of the helium ions and neon ions to diverge. This divergence can be described as follows. Upon exiting the extractor the charged particles of mass, M, and charge, q, has been accelerated to a potential, V. In terms of these variables, the velocity of the charged particle is $v_z$.

$$v_z = \sqrt{\frac{2qV}{M}}$$

The time, t, required for it to traverse region of transverse magnetic field of strength, $B_y$, and length, L, is computed to be:

$$t = \frac{L}{v_z} = L\sqrt{\frac{M}{2qV}}$$

During this time, the charged particles experiences a Lorentz force which introduces a lateral acceleration, $a_x$.

$$a_x = \frac{qv_zB_y}{M}$$

After experiencing this force for the time, t, the particle's transverse velocity is given by $$v_x = a_x t = \frac{qv_zB_y}{M}\frac{L}{v_z}$$

Assuming the transverse velocity is small compared to $v_z$, then the angular deflection is well approximated by:

$$\alpha = \frac{v_x}{v_z} = B_y L \sqrt{\frac{q}{2MV}}$$

Thus, higher mass ions will suffer smaller angular deflections due to the influence of the magnetic field of separator 810 than will lower mass ions. In the case of helium ions and neon ions, the neon ions are deflected by the magnetic field 0.447 times less than the helium ions. Correspondingly, in the case of helium ions and argon ions, the argon ions are deflected by the magnetic field 0.316 times less than the helium ions, which can result in an even more dramatic separation of the initial ion beam into two ion beams.

Figure 9:
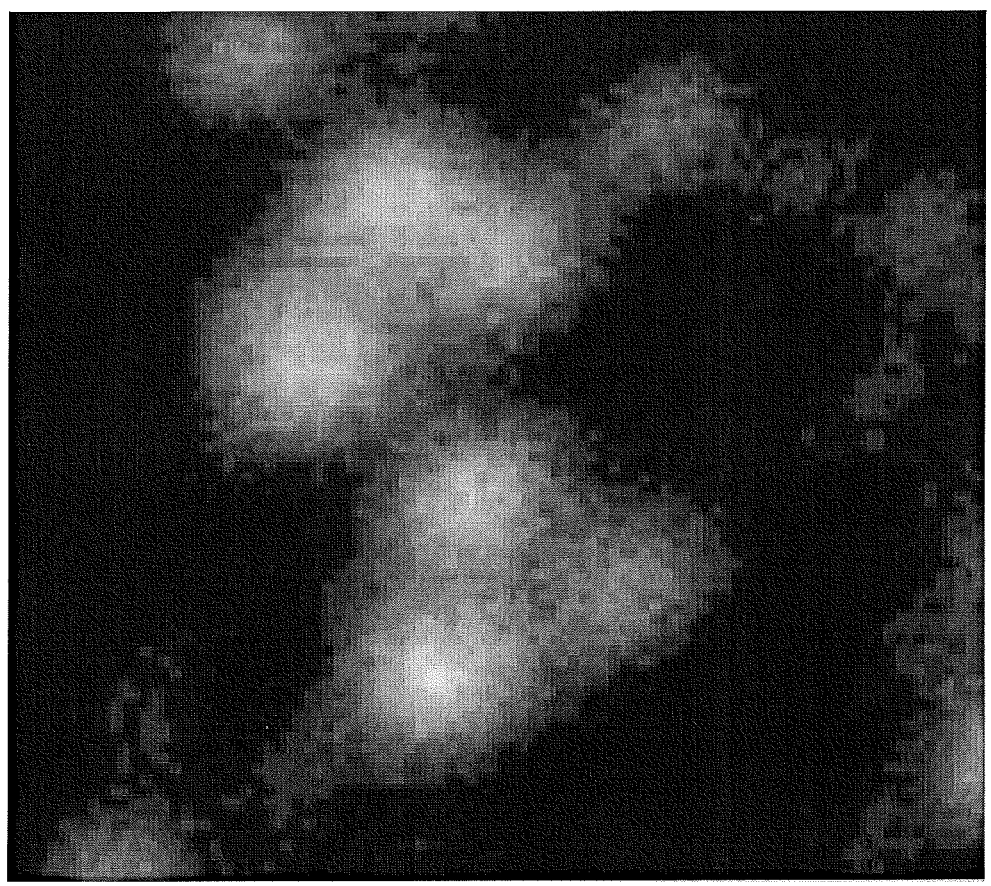
FIG. 9 shows the two trimer images created by using a separator to separate a helium/neon ion beam into separate beams of helium ions and neon ions.

FIG. 9 shows an image of the diagram of the diverging trajectories. A W(111) tip apex was exposed to a gas mixture of helium atoms and neon atoms. Without the magnetic field, the emission pattern would appear as a single trimer. However, as shown in FIG. 9, when the magnetic field is applied the trimer pattern split, revealing the separation into an emission pattern of neon ions and an emission pattern of helium ions, where the beam of neon atoms is displaced less than the beam of helium ions.

In general, any magnetic field source may be used as separator 810. Examples of magnetic field sources include a permanent magnet, a wire (e.g., a coiled wire) configured so that, as electrical current passes therethrough, the wire creates a magnetic field, and a pair of Helmholtz coils. Permanent magnets can be moved into place, or a fixed magnetic coil can be used with or without magnetic pole pieces. If separation is used to remove an undesired ion beam, the undesired ion beam can be stopped by directing it to a receptacle, while the desired beam can pass through an aperture to the final optics.

Generally, beam separator 810 is efficient in separating components of ion beam 800 based on their mass. As an example, in embodiments in which beam 800 contains both neon ions and helium ions, the ratio of the amount of ion beam 800 that is composed of Ne (e.g., as measured by the percentage of the total ion beam) to the amount of ion beam 820 that is composed of Ne ions (e.g., as measured by the percentage of the total ion beam) can be at least two (e.g., at least five, at least 10, at least 100, at least 500, at least 1000). As another example, in embodiments in which beam 800 contains both neon ions and helium ions, the ratio of the amount of ion beam 800 that is composed of He ions (e.g., as measured by the percentage of the total ion beam) to the amount of ion beam 830 that is composed of He ions (e.g., as measured by the percentage of the total ion beam) can be at least two (e.g., at least five, at least 10, at least 100, at least 500, at least 1000). More generally, the ratio of the amount ion beam 800 that is composed of a heavier component (e.g., as measured by the percentage of the total ion beam) to the amount of ion beam 820 that is composed of the heavier component (e.g., as measured by the percentage of the total ion beam) can be at least two (e.g., at least five, at least 10, at least 100, at least 500, at least 1000), and/or the ratio of the amount ion beam 800 that is composed of a lighter component (e.g., as measured by the percentage of the total ion beam) to the amount of ion beam 830 that is composed of the lighter component (e.g., as measured by the percentage of the total ion beam) can be at least two (e.g., at least five, at least 10, at least 100, at least 500, at least 1000).

In some embodiments, the ratio of the amount ion beam 820 or 830 that is composed of a first component, which is desired to be concentrated, (e.g., as measured by the percentage of the total ion beam) to the amount of ion beam 800 that is composed of the second component (e.g., as measured by the percentage of the total ion beam) before interaction with the beam separator is at least two (e.g., at least five, at least 10, at least 100, at least 500, at least 1000). As an example, in embodiments in which beam 800 contains both neon ions and helium ions, the ratio of the amount ion beam 830 that is composed of Ne ions (e.g., as measured by the percentage of the total ion beam) to the amount of ion beam 800 that is composed of He ions (e.g., as measured by the percentage of the total ion beam) can be at least two (e.g., at least five, at least 10, at least 100, at least 500, at least 1000). As another example, in which beam 800 contains both neon ions and helium ions, the ratio of the amount ion beam 820 that is composed of He ions (e.g., as measured by the percentage of the total ion beam) to the amount of ion beam 800 that is composed of Ne ions (e.g., as measured by the percentage of the ion beam composed of He ions) can be at least two (e.g., at least five, at least 10, at least 100, at least 500, at least 1000).

While embodiments have been described in which a beam separator is used to separate ions of different gases, in some embodiments, a beam separator can be used to separate ions of different isotopes of a gas. In such embodiments, the beam separator can also be used to remove undesirable isotopes from the ion beam. As an example, the beam separator can be used to remove ions of one or more isotopes of Ne so that the resulting beam (the beam that interacts with the sample) is relatively rich in ions of the desired isotope and relatively poor in ions of the undesired isotope. Table II lists certain isotopes and corresponding natural abundances (approximate values due to rounding).

TABLE II

| Isotope | Natural Abundance |
|---------|-------------------|
| He-4    | 99.99986          |
| He-3    | 0.00014           |
| Ne-20   | 0.905             |
| Ne-21   | 0.003             |
| Ne-22   | 0.092             |
| Ar-36   | 0.003             |
| Ar-38   | 0.001             |
| Ar-40   | 0.996             |
| Kr-78   | 0.004             |
| Kr-80   | 0.023             |
| Kr-82   | 0.116             |
| Kr-83   | 0.115             |
| Kr-84   | 0.570             |
| Kr-86   | 0.173             |
| Xe-124  | 0.001             |
| Xe-126  | 0.001             |
| Xe-128  | 0.019             |
| Xe-129  | 0.264             |
| Xe-130  | 0.041             |
| Xe-131  | 0.212             |
| Xe-132  | 0.269             |
| Xe-134  | 0.104             |
| Xe-136  | 0.089             |

In certain embodiments, after interacting with a beam separator, the percentage of ions in a beam that is formed of a desired isotope (e.g., as measured as the percentage of ions in the ion beam that are formed of the isotope) is greater than the natural abundance of the desired isotope. For example, in some embodiments, after interacting with the beam separator, at least 90% (e.g., at least 95%, at least 99%, at least 99.5%, at least 99.9%) of the ions in a resulting ion beam are ions of the desired isotope.

In some embodiments, after interacting with the beam separator, the percentage of ions in a beam that is formed of an undesired isotope (e.g., as measured as the percentage of ions in the ion beam that are formed of the isotope) is less than the natural abundance of the undesired isotope. For example, in some embodiments, after interacting with the beam separator, the percentage of ions in a beam that is formed of the undesired isotope is at least two times (e.g., at least five times, at least 10 times, at least 25 times, at least 50 times, at least 100 times, at least 1000 times) less than the natural abundance of the undesired isotope. In some embodiments, after interacting with the beam separator, at most 10% (e.g., at most 5%, at most 1%, at most 0.5%, at most 0.1%) of the ions in a resulting ion beam are ions of the undesired isotope.

Aspects of using isotopes of ions of a gas in, for example, investigating and/or modifying a sample are disclosed, for example, in international application PCT/US2009/045133, filed May 26, 2009, and hereby incorporated by reference in its entirety.

While embodiments have been described in which the beam separator is used to separate ions of different gases or ions of different isotopes of a gas, in some embodiments, the beam separator can be used to separate ions of different gases and ions of different isotopes of a gas. Optionally, multiple beam separators can be used. As an example, one or more beam separators can be used to separate ions of different gases, and one or more additional beam separators can be used to separate isotopes of a gas. Further, alternatively or additionally, a beam separator may use electric fields to separate components of an ion beam. In general, a beam separator can use various combinations of electric and magnetic fields.

While described as being present in the ion optics, more generally, a beam separator can be present anywhere along the ion beam path between the tip and the sample. Further, while a single beam separator (optionally composed of multiple components) has been described, more generally, multiple beam separators can be used. Moreover, while embodiments have been described in which an aperture is used in conjunction with a beam splitter, in certain embodiments, an aperture is not present.

Using a Second Gas to Enhance Stability of an Ion Beam of a First Gas

In some cases, the performance of a gas field ion microscope can be limited by the brightness and/or energy spread of the gas field ion source. The brightness is generally measured as the current per solid angle per emission area. A high brightness is generally desired to allow the beam to focused to a small probe size. A low energy spread is often desired to reduce the chromatic aberrations of the ion optical elements. Further, in some instances, the gas field ion source lifetime can greatly impact the commercial viability of a gas field ion source. These limitations may be present, for example, when using helium as the gas for a gas field ion microscope system.

Figure 10A:
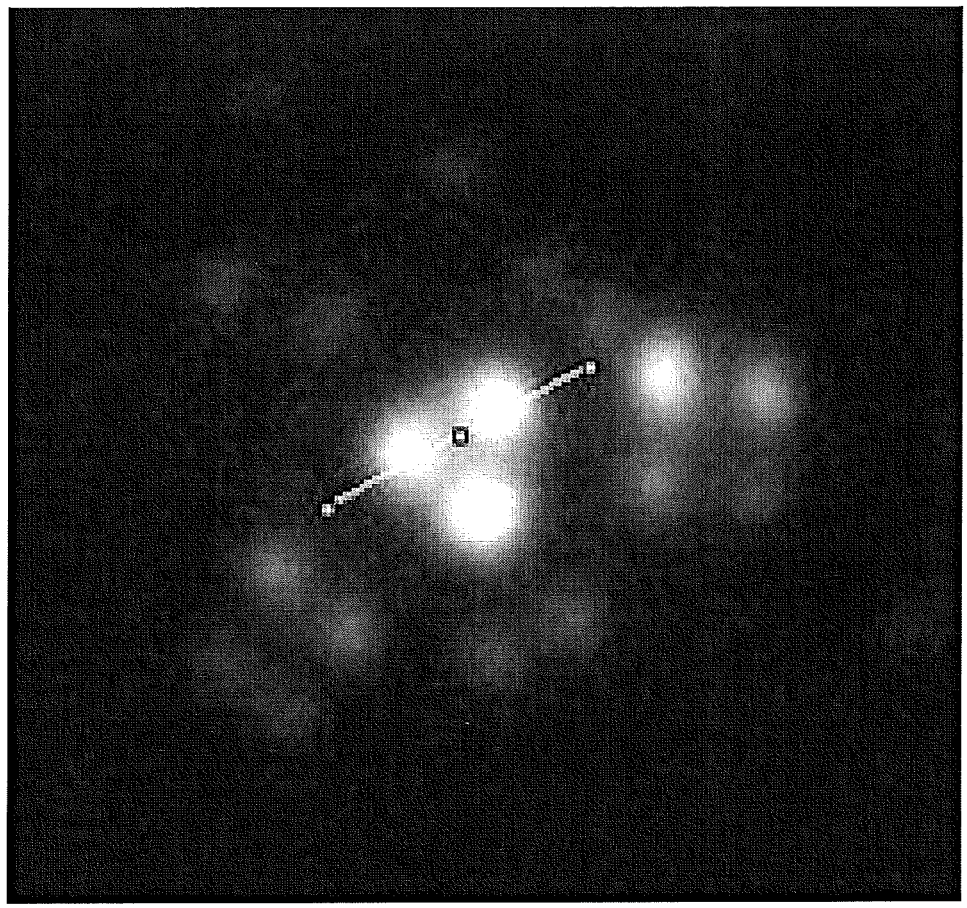
FIGS. 10A and 10B are images that show that the angular dispersion of the ion beam is reduced when a small amount of neon is introduced to helium.
Figure 10B:
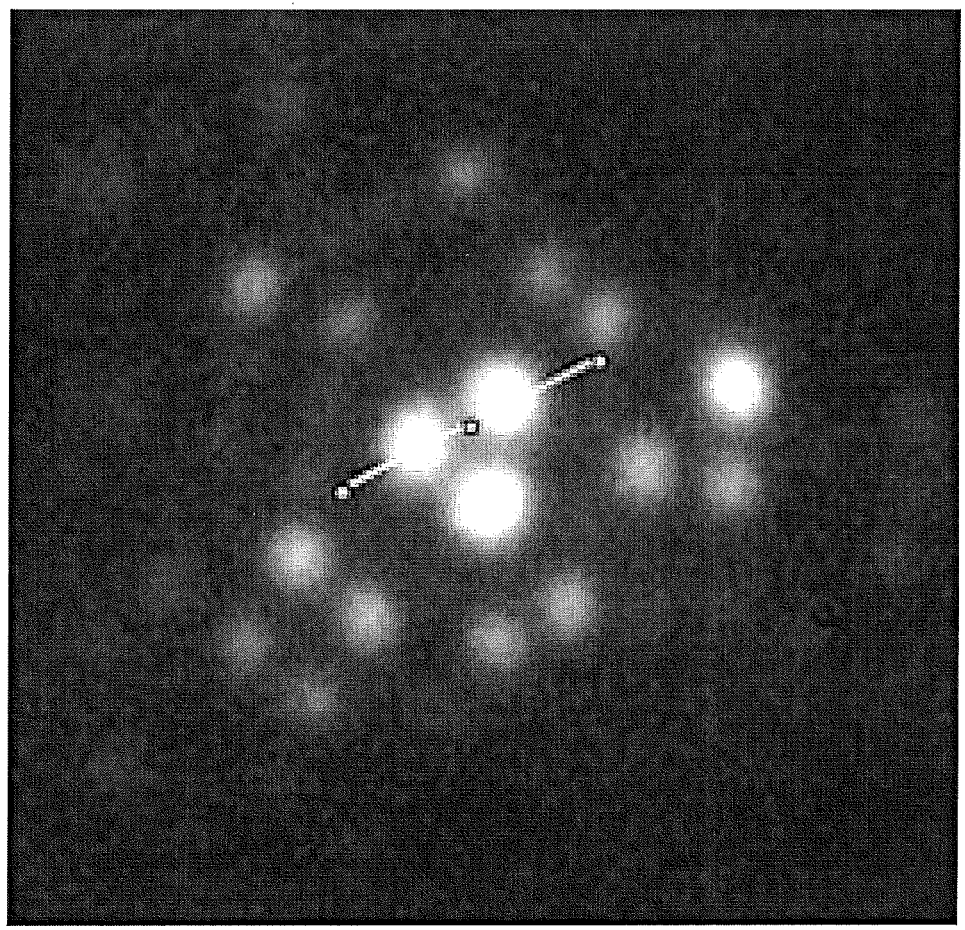
Figure 11B:
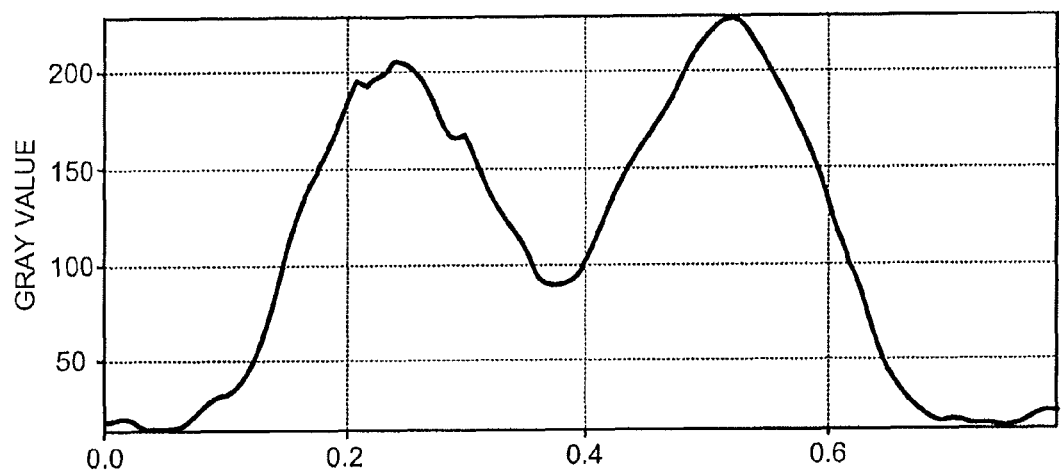
FIGS. 11A and 11B are line profiles for two adjacent atoms in the images of FIGS. 10A and 10B, respectively.
Figure 11A:
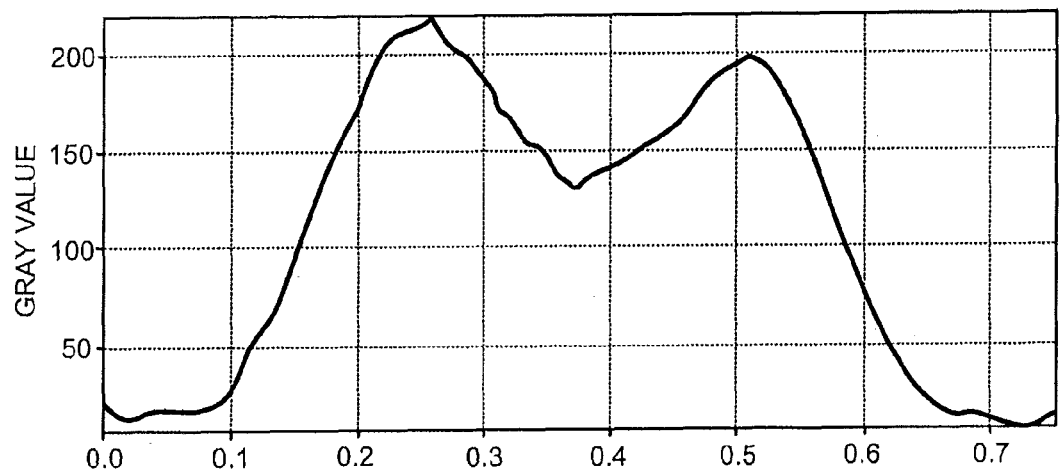

It has been found that the performance of a helium ion source can be greatly improved by the addition of a small amount of neon and the operation at a slightly lower operating voltage. For example for a given tip geometry, the normal operating voltage is 35 kV, with a helium gas pressure of $2\times10^{-4}$ torr. Then for the same tip geometry, much better performance can be attained with an operating voltage of 32 kV and the inclusion of $1\times10^{-5}$ partial pressure of neon. Referring to FIGS. 10A (FIM image of a W(111) tip apex with a trimer terminal shelf using 100% helium gas at 27.5 kV) and 10B (FIM image of a W(111) tip apex with a trimer terminal shelf using 99% helium gas+1% neon gas at 27.5 kV), it can be seen that the better performance is manifested in a narrower angular emission pattern (higher brightness giving rise to smaller probe size). FIGS. 11A and 11B are line profiles for two adjacent atoms in the images of FIGS. 10A and 10B, respectively.

Without being bound by theory, it is believed that this benefit arises from the fact that an adatom of neon is responsible for the ionizations happening further off from the tip apex surface where the field is more uniform. Because the tip apex field is more uniform, it is also likely that the energy spread will also be reduced, resulting in a smaller probe size. The extended lifetime is a natural consequence of operating at a lower operating voltage where the emitter atoms feel a weaker field.

In certain embodiments, using a gas mixture that includes at least two different noble gases can result in a relatively stable ion beam. For example, in some embodiments, the ion beam can have a current at a sample that changes by less than 10% (e.g., less than 9%, less than 8%, less than 7%, less than 6%, less than 5%, less than 4%, less than 3%, less than 2%, less than 1%) during a period of time of at least 30 seconds (e.g., 60 seconds, 50 seconds, 40 seconds, 30 seconds).

In some embodiments, using a gas mixture that includes at least two different noble gases can result in a relatively stable ion beam source. For example, in some embodiments, the gas field ion source can form an ion beam with a duty cycle of at least 90% (e.g., at least 95%, at least 99%, least 99.5%) for a period of time (e.g., at least one day, at least three days, at least one week). As used herein, the duty cycle of a gas field ion source in a given time period is equal to (100%-X), where X is the percentage of the time period that the gas field ion source is not used to create an ion beam during the time period because the gas field ion source is being rebuilt or replaced. As an example, if during a period of time of the gas field ion source is not rebuilt or replaced, then the duty cycle is 100% for that period of time. As another example, if during a period of one day, three hours are spent rebuilding the tip and no time is spent replacing the tip, then the duty cycle is 87.5% for that day. As a further example, if during a period of one day, three hours are spent replacing the tip and no time is spent rebuilding the tip, then the duty cycle is 87.5% for that day. As an additional example, if during a period of one day, three hours are spent replacing the tip and another three hours are spent rebuilding the tip, then the duty cycle is 75% for that day.

Data may be collected to develop a table that lists the performance of the gas field ion microscope (e.g., ion beam stability, duty cycle) as a function of the mixture of gases (e.g., amount of He, amount of Ne). This table may then be used to predict the performance of the gas field ion tip. In some embodiments, an operator can determine a desired ion beam stability of a gas field ion source, and, based on the desired ion beam stability, determine a gas mixture to use to form an ion beam. In certain embodiments, an operator can determine a desired duty cycle of the gas field ion source, and, based on the desired duty cycle of the gas field ion source, determine a gas mixture to use to form an ion beam using the gas field ion source. In some embodiments, an operator will choose a gas mixture that provides the desired stability or duty cycle. In such embodiments, the addition of the second gas may no adverse effects.

Gas Mixtures

As discussed above, in some embodiments, the gases introduced into system 100 include at least two different noble gases (He, Ne, Ar, Kr, Xe). Various combinations (He/Ne, He/Ar, He/Kr, He/Xe, Ne/Ar, Ne/Kr, Ne/Xe, Ar/Kr, Ar/Xe, Kr/Xe) are possible. Typically, one of the noble gases is the majority constituent of the gas mixture, and another noble gas is used to enhance the stability of the ion beam formed. As an example, in some embodiments, the ion beam of interest is a Ne ion beam, and an amount of He is deliberately introduced into housing 110 to enhance the stability of the Ne ion beam. In such embodiments, the gas mixture will generally include a greater amount of Ne than He. Optionally, one or more of the gases can be a non-noble gas. As an example, in some embodiments, one of the gases can be molecular hydrogen gas ($H_2$).

In some embodiments, the gas mixture includes at least 10% (e.g., at least 20%, at least 30%, at least 40%, at least 50%) of a first noble gas and/or at most 10% (e.g., at most 9%, at most 8%, at most 7%, at most 6%, at most 5%, at most 4%, at most 3%, at most 2%, at most 1%) of the second noble gas. As an example, in certain embodiments, the desired beam is helium and the first noble gas is He, and the second noble gas is Ne. In such embodiments, the gas mixture can include, for example, 90% helium and 10% neon.

Samples, Sample Inspection and Sample Modification

An example of a sample is a semiconductor article. Semiconductor fabrication typically involves the preparation of an article (a semiconductor article) that includes multiple layers of materials sequentially deposited and processed to form an integrated electronic circuit, an integrated circuit element, and/or a different microelectronic device. Such articles typically contain various features (e.g., circuit lines formed of electrically conductive material, wells filled with electrically non-conductive material, regions formed of electrically semi-conductive material) that are precisely positioned with respect to each other (e.g., generally on the scale of within a few nanometers). The location, size (length, width, depth), composition (chemical composition) and related properties (conductivity, crystalline orientation, magnetic properties) of a given feature can have an important impact on the performance of the article. For example, in certain instances, if one or more of these parameters is outside an appropriate range, the article may be rejected because it cannot function as desired. As a result, it is generally desirable to have very good control over each step during semiconductor fabrication, and it would be advantageous to have a tool that could monitor the fabrication of a semiconductor article at various steps in the fabrication process to investigate the location, size, composition and related properties of one or more features at various stages of the semiconductor fabrication process. As used herein, the term semiconductor article refers to an integrated electronic circuit, an integrated circuit element, a microelectronic device or an article formed during the process of fabricating an integrated electronic circuit, an integrated circuit element, a microelectronic device. In some embodiments, a semiconductor article can be a portion of a flat panel display or a photovoltaic cell. Regions of a semiconductor article can be formed of different types of material (electrically conductive, electrically non-conductive, electrically semiconductive). Exemplary electrically conductive materials include metals, such as aluminum, chromium, nickel, tantalum, titanium, tungsten, and alloys including one or more of these metals (e.g., aluminum-copper alloys). Metal silicides (e.g., nickel silicides, tantalum silicides) can also be electrically conductive. Exemplary electrically non-conductive materials include borides, carbides, nitrides, oxides, phosphides, and sulfides of one or more of the metals (e.g., tantalum borides, tantalum germaniums, tantalum nitrides, tantalum silicon nitrides, and titanium nitrides). Exemplary electrically semi-conductive materials include silicon, germanium and gallium arsenide. Optionally, an electrically semiconductive material can be doped (p-doped, n-doped) to enhance the electrical conductivity of the material. Typical steps in the deposition/processing of a given layer of material include imaging the article (e.g., to determine where a desired feature to be formed should be located), depositing an appropriate material (e.g., an electrically conductive material, an electrically semi-conductive material, an electrically non-conductive material) and etching to remove unwanted material from certain locations in the article. Often, a photoresist, such as a polymer photoresist, is deposited/exposed to appropriate radiation/selectively etched to assist in controlling the location and size of a given feature. Typically, the photoresist is removed in one or more subsequent process steps, and, in general, the final semiconductor article desirably does not contain an appreciable amount of photoresist.

Figure 12A:
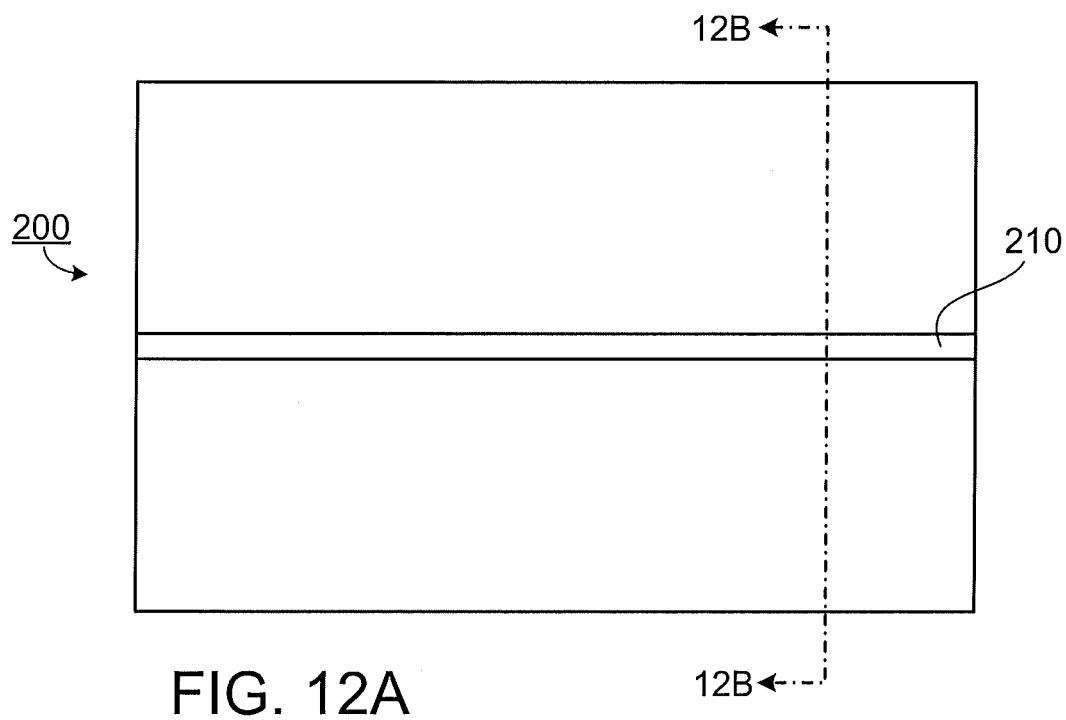
FIGS. 12A and 12B are top and cross-sectional views, respective, of a sample. Like reference symbols in the various drawings indicate like elements.
Figure 12B:
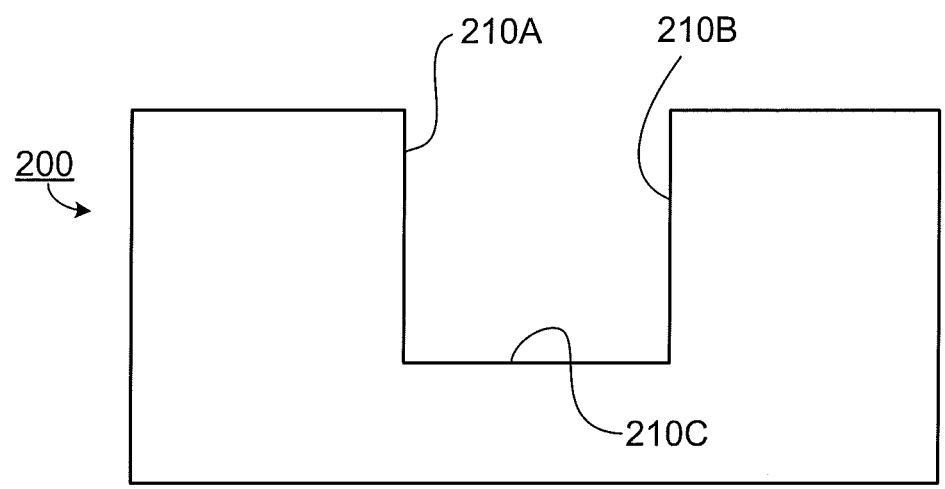

FIGS. 12A and 12B show partial top and cross-sectional views, respectively, of a semiconductor article 200. As shown in FIG. 12B, article 200 has been cut to expose a cross-section 210 with sidewalls 210A and 210B and bottom wall 210C. Although not shown in FIGS. 12A and 12B, semiconductor article 200 includes many layers of different materials, and, in some instances, multiple different materials within the same layer.

In some embodiments, the systems and methods can be used to modify (e.g., repair) a sample (e.g., to repair a region of the article at or near the portion of the article exposed by the cross-section). Such modification of a sample can involve sputtering, such as, for example, sputtering with Ne ions. In some instances, when fabricating articles, it can be desirable during certain steps to remove materials (e.g., when removing undesired material from a circuit to edit the circuit, when repairing a mask). An ion beam can be used for this purpose where the ion beam sputters material from the sample. In particular, an ion beam generated via the interaction of gas atoms with a gas field ion source as described herein can be used for sputtering a sample. Although He gas ions may be used, it is typically preferable to use heavier ions (e.g., Ne gas ions, Ar gas ions, Kr gas ions, Xe gas ions) to remove material. During the removal of material, the ion beam is focused on the region of the sample where the material to be removed is located.

In certain embodiments, sample modification can involve gas assisted chemistry, which can be used to add material to and/or remove material to a sample (e.g., a given layer of the sample). As an example, gas assisted chemistry can be used for semiconductor circuit editing in which damaged or incorrectly fabricated circuits formed in semiconductor articles are repaired. Typically, circuit editing involves adding material to a circuit (e.g., to close a circuit that is open) and/or removing material from a circuit (e.g., to open a circuit that is closed). Gas assisted chemistry can also be used in photolithographic mask repair. Mask defects generally include an excess of mask material in a region of the mask where there should be no material, and/or an absence of mask material where material should be present. Thus, gas assisted chemistry can be used in mask repair to add and/or remove material from a mask as desired. Typically, gas assisted chemistry involves the use of a charged particle beam (e.g., ion beam, electron beam, both) that interacts with an appropriate gas (e.g., $Cl_2$, $O_2$, $I_2$, $XeF_2$, $F_2$, $CF_4$, $H_2O$, $XeF_2$, $F_2$, $CF_4$, $WF_6$, $W(CO)_6$).

In certain embodiments, it is desirable to inspect the sample. An example of such detection involves the detection of voids. During the fabrication of a semiconductor article, voids in certain features or layers may be inadvertently formed. In some embodiments, the voids can undesirably impact the properties (e.g., electrical, mechanical) of the feature and/or the overall device. Subsequent processing steps may open the void, and the void may, for example, fill with liquid and/or gaseous components. This can cause corrosion of the underlying structures, particle defects and/or residue defects on the surrounding wafer surface. Ultimately, the presence of voids can result in deviation of electrical and/or mechanical properties from desired (e.g., designed) values.

Another example of the defect detection of a semiconductor article involves overlay shift registration. Overlay shift registration generally refers to the alignment of a feature of a given layer of a semiconductor article with a feature in a different layer of the semiconductor article. As noted above, the formation of a semiconductor article generally involves the proper formation of many layers. Typically, a semiconductor article contains well over 20 layers. Often, each layer can contain multiple different features, each of which is desirably located with high precision so that the semiconductor article can function properly. As an example, a semiconductor article can contain lateral features, such as electrically conductive wires, which are in different layers and connected to each other by a via. In general, it is desirable to have features within the semiconductor article properly aligned with each other.

An additional example of defect detection involves critical dimension metrology. Critical dimension metrology refers to the measurement of the linear dimensions of features in a semiconductor article that can have a critical impact on the performance of the device. Examples of such features can include lines (e.g., lines of electrically conductive material, lines of electrically semiconductive conductive material, lines of electrically non-conductive material). A semiconductor article can contain one or more features having a size dimension of 20 nm or less (e.g., 10 nm or less, five nm or less, four nm or less, three nm or less, two nm or less, one nm or less). In some embodiments, the size of the feature is measured multiple times to provide statistical information regarding the size of the feature. Critical dimension measurements frequently involve, e.g., the determination of the length of a patterned feature on a wafer, for example. Wafers (containing multiple dies, with each die forming a semiconductor article) may be selected at random from a fabrication line for inspection, or all wafers on the line can be inspected. An imaging instrument can be used to measure selected critical dimensions at a relatively high throughput rate. If the measured critical dimension does not fall within acceptable limits, the wafer may be discarded. If multiple samples originating from a particular fabrication machine have critical dimensions outside acceptable limits, the machine may be taken out of service, or its operating parameters changed.

A further example of defect detection involves line edge roughness and/or line width roughness. Line edge roughness generally refers to the roughness of the edge of a line of material in a semiconductor article, and line width roughness generally refers to the roughness of the width of a line of material in a semiconductor article. It can be desirable to understand these values to determine whether actual or potential problems exist in a given semiconductor article. For example, if adjacent lines formed of electrically conductive material have edges that bulge outward toward each other, the lines may contact each other resulting in a short. It can be desirable to understand the dimensions of line edge roughness and/or line width roughness to within five nm or less (e.g., four nm or less, three nm or less, two nm or less, one nm or less, 0.9 nm or less, 0.8 nm or less, 0.7 nm or less, 0.6 nm or less, 0.5 nm or less).

While the foregoing discussion relates to samples in the form of semiconductor articles, more generally, any type of sample can be used. Examples of samples include biological samples (e.g., tissue, nucleic acids, proteins, carbohydrates, lipids and cell membranes), pharmaceutical samples (e.g., a small molecule drug), frozen water (e.g., ice), read/write heads used in magnetic storage devices, and metal and alloy samples.

Samples, Sample Inspection and Sample Modification are disclosed in, for example, US 2007-0158558.

In general, various aspects of the foregoing embodiments can be combined as desired.

Other embodiments are covered by the claims.

What is claimed is:

1. A method, comprising:
    using a gas field ion source to generate a first ion beam comprising ions of a first gas and ions of a second gas different from the first gas; and
    separating the first ion beam into a second ion beam and a third ion beam in a single step, the first ion beam comprising at least 10% ions of the first gas and at most 1% ions of the second gas, the second ion beam comprising at least 10% ions of the second gas and at most 1% ions of the first gas.

2. The method of claim 1, further comprising imaging a tip of the gas field ion source using the first and second ion beams.

3. The method of claim 1, further comprising simultaneously interacting the second and third ion beams with a sample to investigate and/or modify the sample.

4. The method of claim 1, further comprising exposing the gas field ion source to atoms of both the first gas and the second gas to generate the first ion beam.

5. The method of claim 4, wherein a pressure of the first gas is at most four times a pressure of the second gas, and/or the pressure of the first gas is at least 0.25 times the pressure of the second gas.

6. The method of claim 1, wherein the first gas is a first noble gas, and/or the second gas is a noble gas.

7. The method of claim 1, wherein the second ion beam comprises at least 25% ions of the first gas, and/or the third ion beam comprises at least 25% ions of the second gas.

8. The method of claim 1, wherein the second ion beam comprises at most 0.1% ions of the second gas, and/or the third ion beam comprises at most 0.1% ions of the first gas.

9. The method of claim 1, using an ion beam separator comprising a magnetic field source to separate the first ion beam into the second and third ion beams.

10. The method of claim 9, wherein the ion beam separator comprises a combination of magnetic and electric fields.

11. The method of claim 9, wherein the first ion beam comprises ions of different isotopes of an atom, the second ion beam comprises ions of a first isotope of the atom, and the third ion beam comprises ions of a second isotope of the atom.

12. A system, comprising:
    a gas field ion source capable of generating a first ion beam comprised of ions with different masses; and
    an ion beam separator configured so that during use of the system the ion beam separator separates ions in the first ion beam into second and third ion beams in a single step, the second ion beam comprising at least 10% ions of a first mass and at most 1% ions of a second mass different from the first mass, and the third ion beam comprising at least 10% ions of the second mass and at most 1% ions of the first mass.

13. The system of claim 12, wherein the ion beam separator separates the first ion beam into the second and third ion beams based on at least one parameter selected from the group consisting of ion mass, ion charge and ion velocity.

14. The system of claim 12, wherein the system comprises ion optics configured to direct ions from the gas field ion source to a sample during use of the system, and the ion optics comprise the ion beam separator.

15. The system of claim 14, wherein the ion optics further comprise an aperture.

16. The system of claim 12, wherein the ion beam separator is capable of generating a magnetic field and an electric field.

17. The system of claim 12, wherein the ion beam separator separates ion beams of the same atoms, but of different isotopic masses.

18. The system of claim 12, wherein the system is a gas field ion microscope.

19. The method of claim 1, wherein forming the first ion beam comprises exposing the gas field ion source to a gas mixture comprising at least 80% of the first gas and at most 20% of the second gas.

20. The method of claim 19, wherein the gases are both noble gases.

21. The method of claim 19, wherein the ion beam has a current at a sample that changes by less than 10% during a period of time that is at least 30 seconds.

22. The method of claim 19, wherein the gas field ion source has a duty cycle of at least 90% for a time period of at least one day.

23. The method of claim 19, wherein the presence of the second gas allows the system to produce an ion beam with an angular current density that is increased by at least 20%.

24. The method of claim 19, wherein the presence of the second gas allows the system to produce an ion beam with an energy spread that is reduced by at least 20%.

25. The method of claim 19, wherein the presence of the second gas allows the system to produce an ion beam with an angular spread that is reduced by at least 20%.

26. The method of claim 19, wherein the presence of the second gas reduces the fluctuations in emission current by 50%.

* * * * *

UNITED STATES PATENT AND TRADEMARK OFFICE
CERTIFICATE OF CORRECTION

PATENT NO. : 8,563,954 B2
APPLICATION NO. : 13/336274
DATED : October 22, 2013
INVENTOR(S) : FHM-Faridur Rahman et al.

Page 1 of 1

It is certified that error appears in the above-identified patent and that said Letters Patent is hereby corrected as shown below:

In the Specification

Col. 7, line 19, delete "Three" and insert -- The --.

Col. 8, lines 2-3, delete "Like reference symbols in the various drawings indicate like elements." and insert -- Like reference symbols in the various drawings indicate like elements." --, on Col. 8, Line 3, as a new paragraph.

Col. 14, line 45 (approx.), delete "by" and insert -- by: --.

Signed and Sealed this
Eighteenth Day of February, 2014

Michelle K. Lee
*Deputy Director of the United States Patent and Trademark Office*